United States Patent [19]

Kuwata

[11] Patent Number: 5,420,963
[45] Date of Patent: May 30, 1995

[54] APPARATUS INCLUDING A NEURAL NETWORK USED FOR SIGNAL PROCESSING, SUCH AS SIGNAL CLUSTERING, SIGNAL IDENTIFICATION, AND A/D CONVERSION

[75] Inventor: Ryuichi Kuwata, Tokyo, Japan

[73] Assignee: Kabushiki Kaisha Toshiba, Kawasaki, Japan

[21] Appl. No.: 840,269

[22] Filed: Feb. 24, 1992

[30] Foreign Application Priority Data

Feb. 26, 1991 [JP] Japan .................................. 3-054055

[51] Int. Cl.$^6$ ............................................. G06F 15/18
[52] U.S. Cl. ....................................... 395/22; 395/24; 395/27; 395/21; 395/11
[58] Field of Search ....................... 395/11, 22, 24, 27, 395/25, 21, 23; 382/10

[56] References Cited

U.S. PATENT DOCUMENTS

| | | | |
|---|---|---|---|
| 4,419,544 | 12/1983 | Adelman | 381/94 |
| 4,660,166 | 4/1987 | Hopfield | 364/300 |
| 4,903,226 | 2/1990 | Tsividis | 395/24 |
| 4,979,124 | 12/1990 | Sachse et al. | 395/22 |
| 5,003,490 | 3/1991 | Castelaz et al. | 395/22 |
| 5,039,870 | 8/1991 | Engeler | 395/24 |
| 5,121,231 | 6/1992 | Jenkins et al. | 395/25 |
| 5,130,563 | 7/1992 | Nabet et al. | 395/25 |
| 5,142,666 | 8/1992 | Yoshizawa et al. | 395/24 |
| 5,151,970 | 9/1992 | Engeler | 395/24 |
| 5,167,006 | 11/1992 | Furuta et al. | 395/11 |
| 5,214,745 | 5/1993 | Sutherland | 395/24 |

FOREIGN PATENT DOCUMENTS

2181283  7/1990 Japan .

OTHER PUBLICATIONS

J. Song and M. Hassoun, "Learning with Hidden Targets"; IJCNN International Joint Conference on Neural Networks; pp. 93–98 vol. 3; 17–21 Jun. 1990.

Wei et al, "Neural network based power system transient stability criterion using DSP-PC system"; ANNPS '93. Proceedings of hte Second International Forum on Applications of Neural Networks to Power Systems, pp. 136–141, 1993.

Choi et al, "VLSI design of compact and high-precision analog neural network processors"; IJCNN International Joint Conference on Neural Networks, pp. 637–641 vol. 2, 7–11 Jun. 1992.

Ho et al, "Stochastic neural direct adaptive control"; Proceedings of the 1991 IEEE International Symposium on Intelligent Control, pp. 176–179, 13–15 Aug. 1991.

*Primary Examiner*—Allen R. MacDonald
*Assistant Examiner*—Tariq Hafiz
*Attorney, Agent, or Firm*—Oblon, Spivak, McClelland, Maier & Neustadt

[57] ABSTRACT

A signal processing apparatus using a neural network according to this invention includes a reference signal generating section for generating a plurality of reference signals having different signal values, a complement signal generating section for receiving the reference signals and an unknown input signal as an object to be processed, and generating a plurality of complement signals, indicating complement values of the corresponding reference signals with respect to a signal value obtained by multiplying the unknown input signal with a natural number, a multiplication section for receiving the reference signals and the complement signals, and multiplying the reference signals with the corresponding complement signals, and a neural network, in which a plurality of neurons are reciprocal-inhibition-coupled, the neurons receive the products obtained by the multiplication section, and the neuron, which receives the product having a largest value, outputs a spark signal.

14 Claims, 14 Drawing Sheets

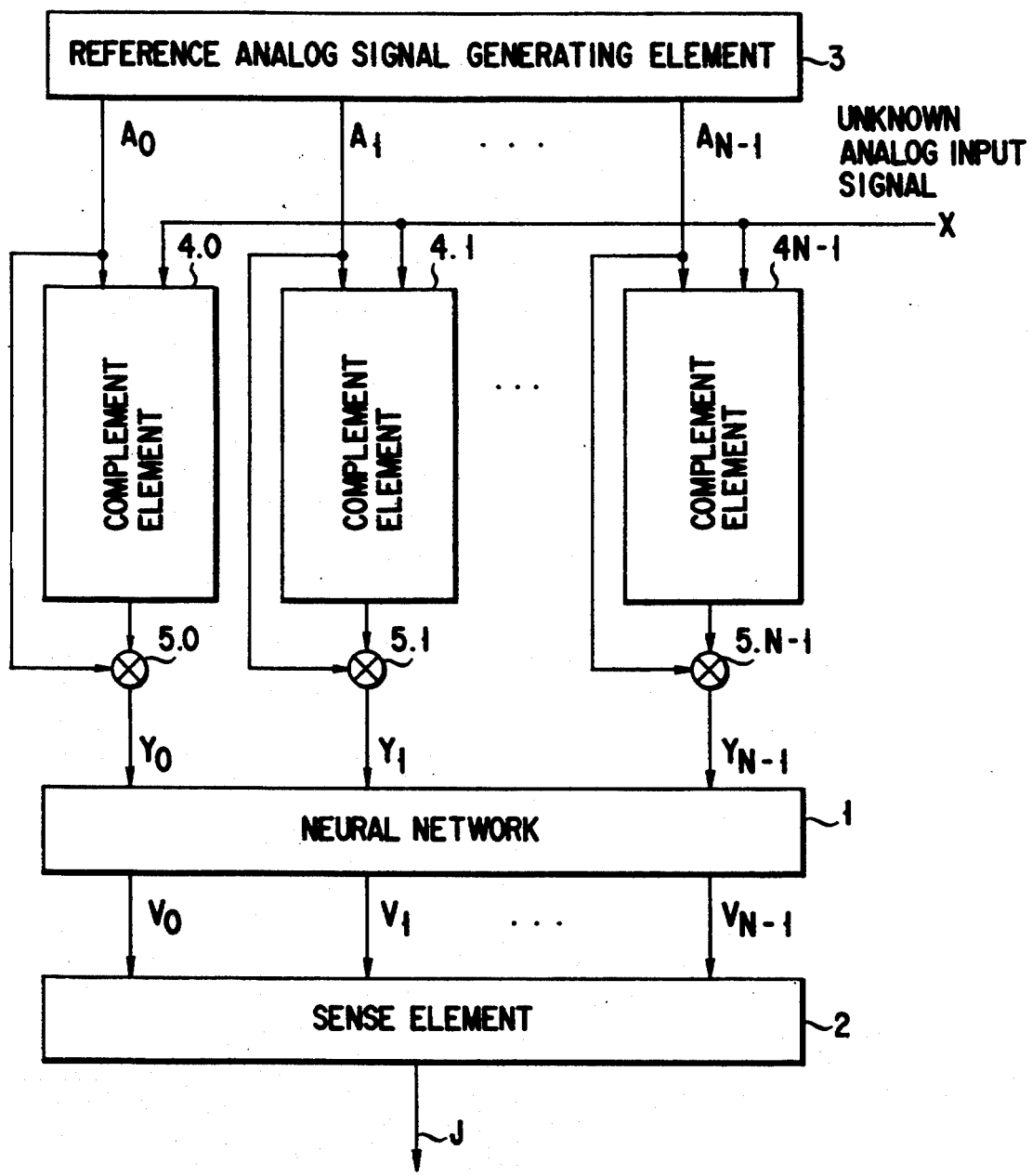
F I G. 1

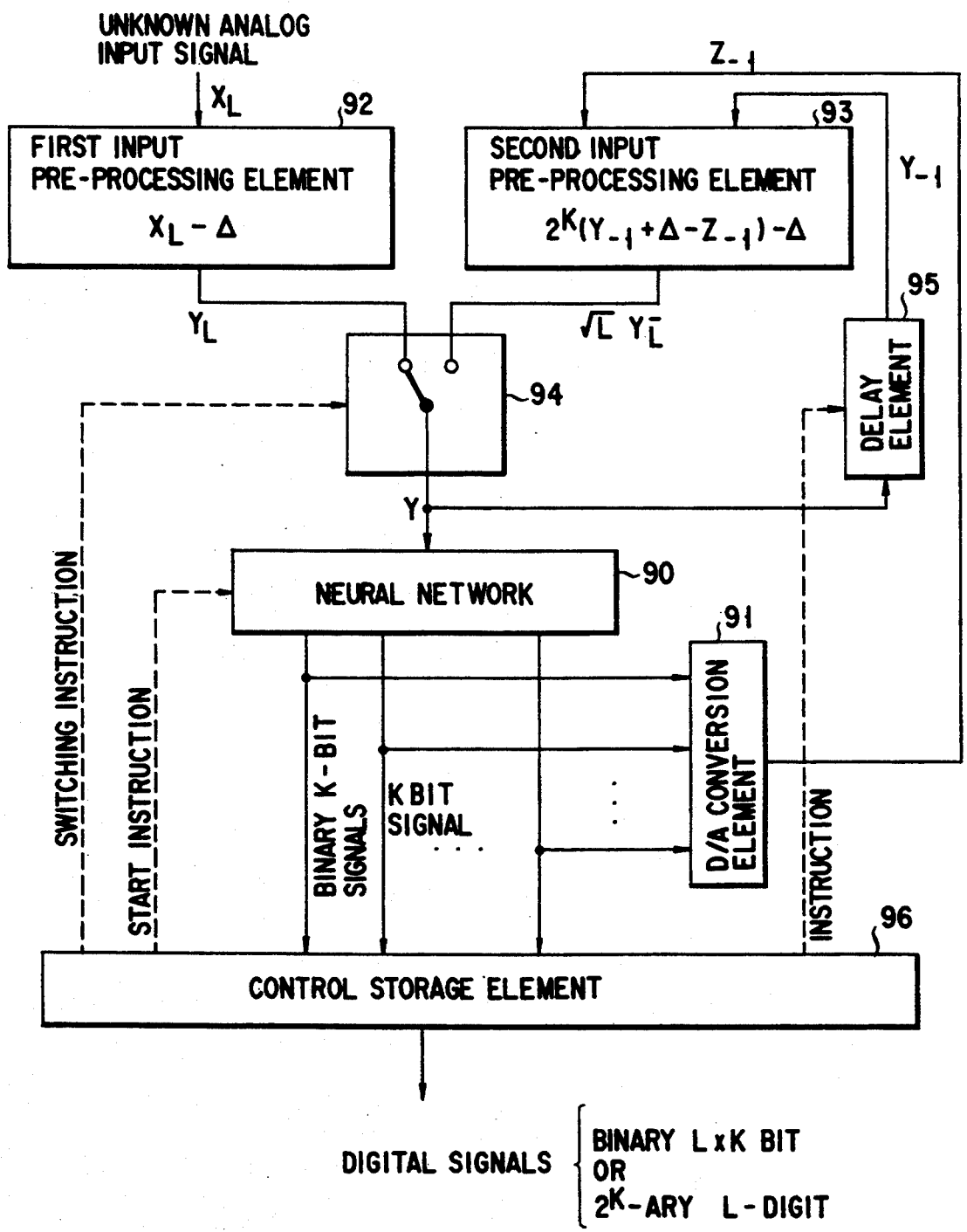
F I G. 12

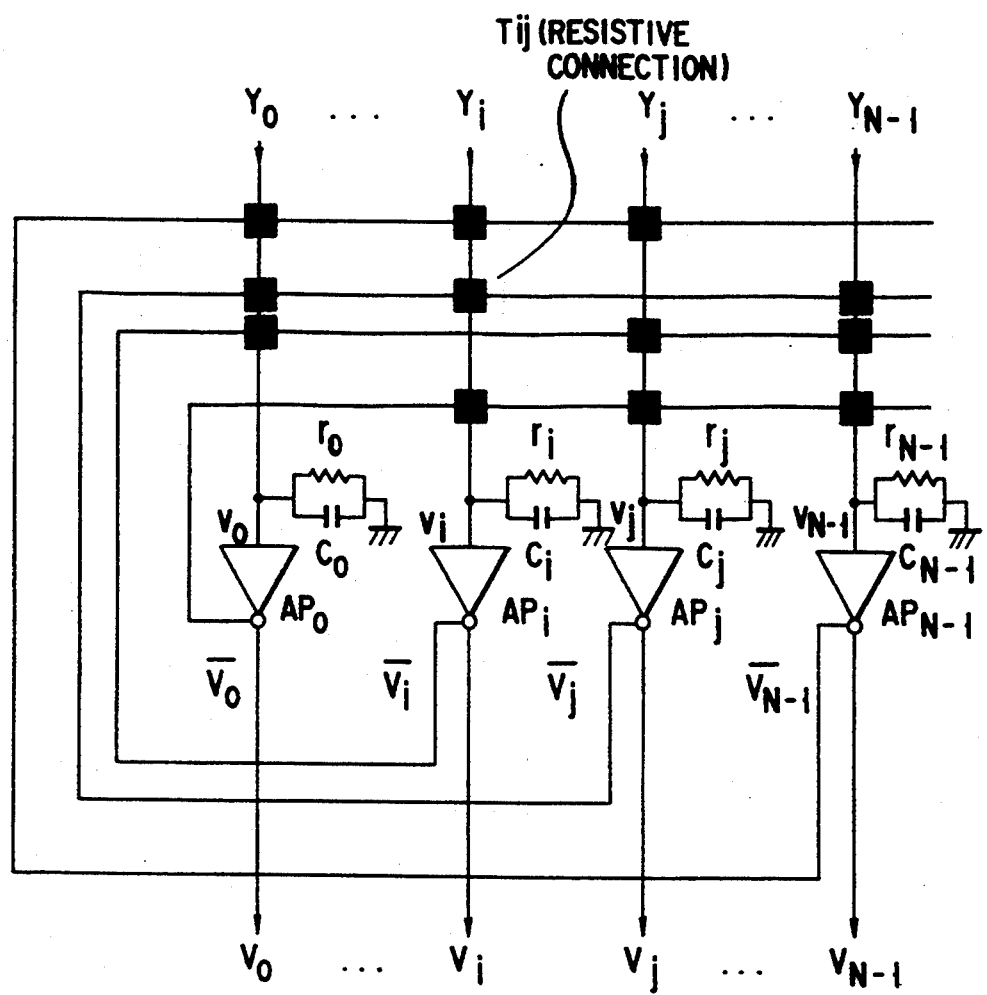
F I G. 14
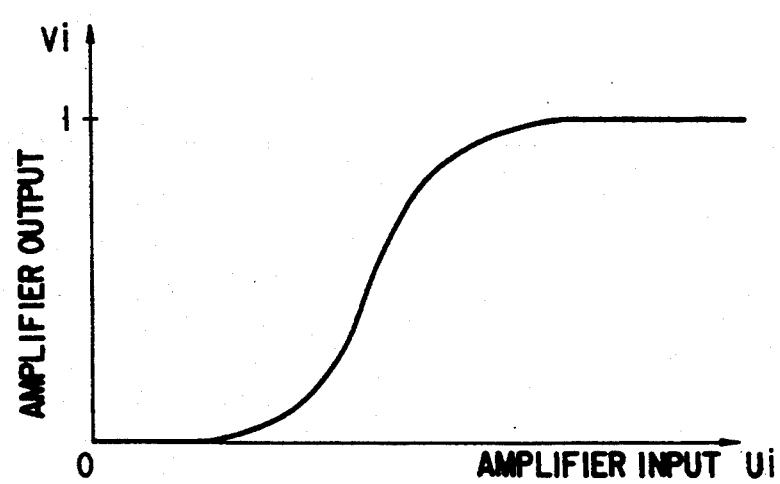
F I G. 15

APPARATUS INCLUDING A NEURAL NETWORK USED FOR SIGNAL PROCESSING, SUCH AS SIGNAL CLUSTERING, SIGNAL IDENTIFICATION, AND A/D CONVERSION

BACKGROUND OF THE INVENTION

1. Field of the Invention

The present invention relates to an apparatus, which can be utilized in preprocessing of signals in, e.g., plant control, and performs signal processing such as clustering or identification of signals, conversion from an analog signal to a digital signal, and the like, using a neural network.

2. Description of the Related Art

When various plants are to be managed and controlled, the temperatures of respective units of a plant are measured by thermocouples or temperature-measuring resistors. However, the thermal electromotive force values or resistance values, and the temperature do not have a fine linear relationship therebetween. When the thermal electromotive force values or resistance values are linearly temperature-converted, accurate values cannot be obtained.

Signals detected by a sensor are clustered according to their magnitudes, and the clustered signals are temperature-converted according to correction formulas determined in correspondence with classes to which the signals belong.

In the clustering, comparison between detection signals and boundary values of each class is repeated for all the classes.

In management and control of steam engines, an enthalpy value must be known from, e.g., the steam pressure on the basis of a steam table. In this case, functions are provided in units of regions of input variables, and comparison between an input variable and a reference value is repeated to determine a region where the input variable is present. Thereafter, the enthalpy value is calculated.

In general, plant management and control are performed by digital computers. Various state amounts of a plant are mainly output as analog signals from sensors. For this reason, A/D converters for converting analog signals into digital signals are used.

More specifically, an analog signal output from a sensor is compared with an analog signal corresponding to the most significant bit of a binary number to determine the relationship therebetween. Then, the analog signal is compared with an analog signal corresponding to the next bit of the binary number to determine the relationship therebetween. Such processing is repeated up to the least significant bit of the binary number, thereby converting the analog signal into a digital signal of a predetermined number of bits.

In inference processing in, e.g., an expert system, collation of bit patterns is repeated to find out a production rule to be applied to that case.

A system for determining a synapse coupling coefficient and a bias input value of a mutual-coupled type neural network on the basis of an energy function so as to convert an analog signal into a binary digital signal of a plurality of bits is also known.

In the above-mentioned various signal processing operations, in order to linearize an output signal from a temperature sensor to obtain a correct temperature signal, to obtain a digital signal by A/D conversion, to calculate an enthalpy value, or to find out a production rule matching with a condition, repetitive processing is required. The repetitive processing requires a long period of time until it is completed.

For this reason, such a signal processing method cannot be applied to fields requiring quick processing. Because, when an alarm is delayed, plant operations may be considerably disturbed, or when a trip is delayed, a plant may be damaged. When the signal processing method is used in a feedback control system, since a dead time undesirably exists in a loop, improvement of controllability is limited. In particular, when high-speed control is necessary, a delay time caused by signal processing is not allowable.

In an A/D converter using a conventional neural network, in order to realize synapse coupling a large number of high-precision resistors having different resistances are required. This fact reveals that such an A/D converter is difficult to realize in fields requiring an A/D converter of a large (12–16 bit) number of digits like in a plant instrumentation control field. In particular, this point becomes a major obstacle when a neural network is realized by the LSI technique.

SUMMARY OF THE INVENTION

The present invention has been made to solve the above drawbacks, and has as its object to provide a signal processing apparatus, which can eliminate or minimize repetitive operations of the signal processing, and can attain high-speed signal processing by utilizing a parallel processing feature of a suppression-mutual-coupling type neural network, which has a function capable of detecting a maximum value.

In order to achieve the above object, a signal processing apparatus of the present invention comprises a reference signal generating section for generating a plurality of reference signals each having different signal values, a complement signal generating section for receiving the reference signals, and an unknown input signal as an object to be processed, and generating a plurality of complement signals indicating complement values of the reference signals, a multiplication section for receiving the reference signals and the complement signals, and multiplying the corresponding complement signals with the reference signals, and a neural network in which a plurality of neurons are suppression-mutual-coupled, products obtained by the multiplication section are input to the neurons, and the neuron, which receives the product having the maximum value, outputs a spark signal.

When this arrangement is employed, a reference analog signal whose value is closest to an unknown analog signal can be detected without performing repetitive operations.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing an arrangement according to the first embodiment of the present invention;

FIG. 12 is a block diagram showing an arrangement for $2^K$-ary L-digit A/D conversion according to the eighth embodiment of the present invention;

FIG. 14, is a block diagram showing a neural network of suppression-mutual-coupling type;

FIG. 15 is a graph showing input/output characteristics of an amplifier in the neural network.

DETAILED DESCRIPTION OF THE PREFERRED EMBODIMENTS

Figure 2:
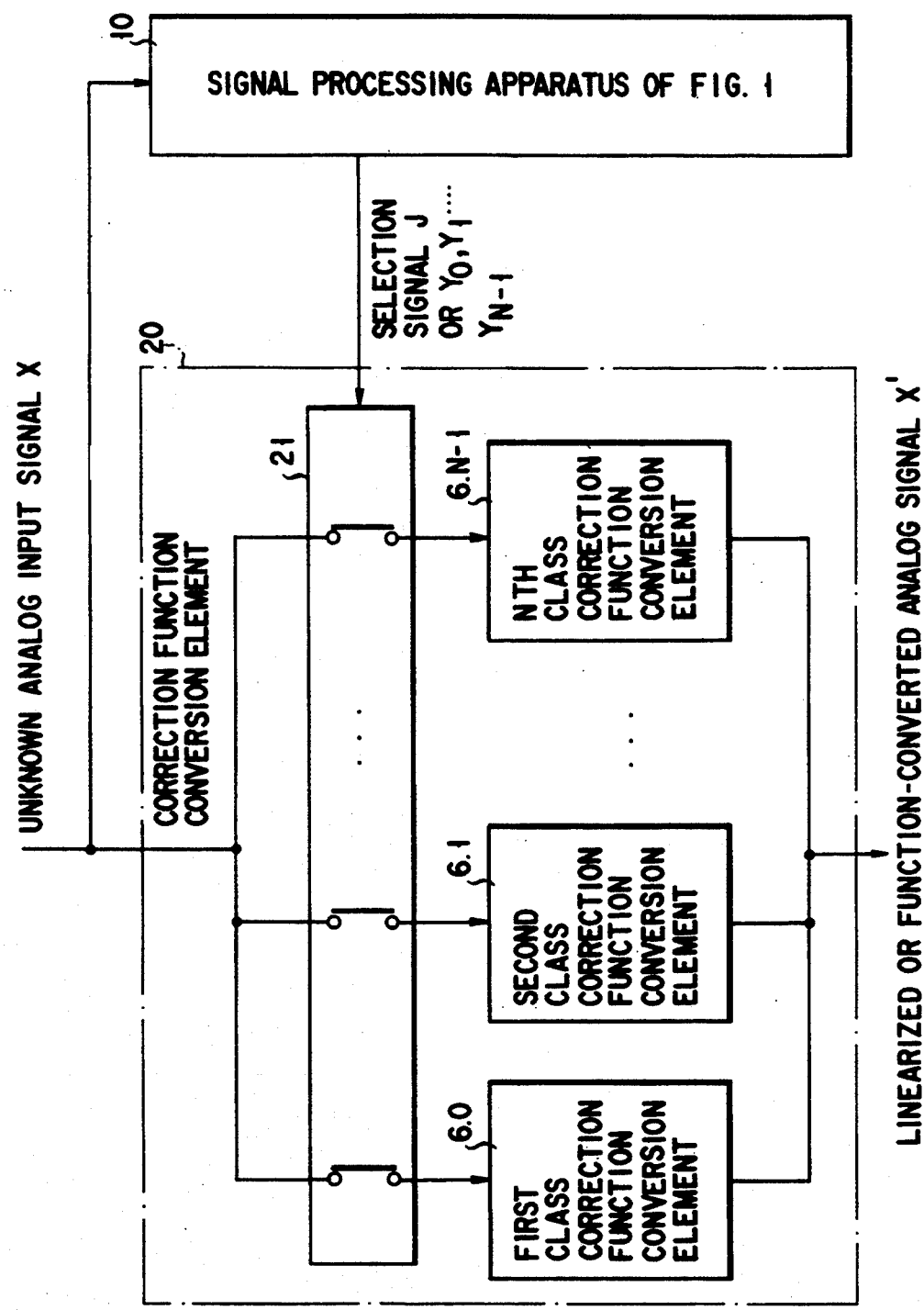
FIG. 2 is a block diagram of an arrangement used in correction function conversion according to the second embodiment of the present invention.

The preferred embodiments of the present invention will be described below with reference to the accompanying drawings.

FIG. 14 shows a neural network realized by an analog electronic circuit. In FIG. 14, each of amplifiers $AP_0$ to $AP_{N-1}$ corresponds to a cell of a single neuron of a living body. The feedback line of an inverted voltage $\bar{v}_j$ of an output voltage $v_j$ from the jth amplifier $AP_j$ is connected to the input line of the "i"th amplifier $AP_i$ through a resistor (a conductance as its reciprocal number is $T_{ij}$). This connection corresponds to inhibition type synapse coupling in a living body.

Paying attention to the "i"th amplifier $AP_i$, the input terminal of the amplifier $AP_i$ is applied with a current obtained by adding a current $\Sigma T_{ij}\cdot\bar{v}_j (=-\Sigma T_{ij}\cdot V_j)$ input through the resistor to an externally input current $Y_i$, and is grounded through a capacitor $C_i$ and a resistor $r_i$. Thus, the "i"th amplifier $AP_i$ is applied with an input voltage $U_i$.

As an output function of the amplifier AP, a sigmoid function, which defines, e.g., input/output static characteristics $g(U_i)$, as shown in FIG. 15, is used. Therefore, the amplifier $AP_i$ outputs the voltage $V_i$ in correspondence with the input voltage $U_i$.

Note that the static characteristics $g(U_i)$ are not limited to the sigmoid function, but may be defined by other functions of similar characteristics.

The characteristics of the neural network shown in FIG. 14 can be expressed by equations (1) to (4):

$$C_i = \frac{dU_i}{dt} = -\frac{U_i}{R_i} - \sum_{j}^{N} T_{ij}\cdot\bar{v}_j + Y_i \qquad (1)$$

$$\frac{1}{R_i} = \frac{1}{r_i} + \sum_{j=i}^{N} T_{ij} \qquad (2)$$

$$V_i(t) = -\bar{v}_i(t) = g[U_i(t)] \qquad (3)$$

$$g(x) = \frac{1}{2}[1 + \tanh(x/x_0)] \qquad (4)$$

The neural network shown in FIG. 14 operates to decrease an energy function (Lyapunov function) given by equation (5) when synapse coupling is symmetrical ($T_{ij}=T_{ji}$, and $T_{ii}=0$). In addition, it is known that the minimal point of an energy value E given by equation (5) corresponds to an attractor (steady state) of a circuit.

$$\begin{aligned} E &= -\frac{1}{2}\sum_{ij}(-T_{ij})V_iV_j - \sum_{i} Y_iV_i + \sum_{i}\frac{1}{R_i}\int_{0}^{v_i} g^{-1}(V)dV \\ &= \frac{1}{2}\sum_{ij}T_{ij}V_iV_j - \sum_{i} Y_iV_i + \sum_{i}\frac{1}{R_i}\int_{0}^{v_i} g^{-1}(V)dV \end{aligned} \qquad (5)$$

Therefore, if suppression-mutual-coupling ($T_{ij}>0$ when $j\neq i$, and $T_{ij}=0$ when $j=i$) is adopted, the first term of the right-hand side of equation (5) becomes a minimum value 0 when the number of amplifiers whose output v="1" is one or less, and other amplifier outputs are "0".

The second term $(-\Sigma Y_i\cdot V_i)$ is minimized when the output from an amplifier, which receives an analog current with a maximum current value, is "1".

The third term may be ignored since it is normally a very small value.

Furthermore, assuming that the suppression coupling conductance values $T_{ij}$ ($i\neq j$) remain the same, and that the first and second terms are considered in combination, the energy function E becomes minimal when the output from the amplifier, which receives the maximum analog current, is "1", and other amplifier outputs are "0", and this circuit is set in a steady state.

More specifically, when a time constant $C_i\cdot R_i$ of the circuit is set to be sufficiently small, the neural network can instantaneously determine a maximum one of N analog inputs. Therefore, upon combination of this neural network and other circuit elements, various signal processing operations for input signals can be realized.

More specifically, the following signal processing operations ① to ⑧ can be performed at high speed.

① N reference analog signal values are represented by $A_i$ (i=0, 1, ..., N-1). Next, complements ($2X-A_i$) of the reference analog signal values $A_i$ with respect to a value 2X obtained by doubling an unknown analog input signal value X are calculated. Products $Y_i$ of the original reference analog signal values $A_i$ and their complements ($2X-A_i$) are given by equation (6):

$$Y_i=A_i(2X-A_i)=-(A_i-X)^2+X^2 \qquad ...(6)$$

Equation (6) represents an upward convex quadratic function in association with $A_i$. For this reason, of the N reference analog signal values $A_i$, if $A_J$ of $i=J$ is assumed to be closest to X, $Y_i$ at that time becomes a maximum value $Y_j$.

Therefore, when $Y_i$ ($i=0, 1, \ldots, N-1$) is input to a neural network consisting of N neurons and having a function of detecting a maximum input, and the neural network is operated, a Jth artificial neuron sparks. Upon detection of the sparking artificial neuron, $A_J$ closest to the input signal X of the plurality of reference analog signals $A_i$ can be detected.

If complements of $A_i$ with respect to X are used in place of the complements of $A_i$ with respect to 2X, $Y_i$ is given by equation (7):

$$Y_i = A_i(X - A_i) = -\{A_i - (X/2)\}^2 + (X/2)^2 \quad \ldots (7)$$

From equation (7), it can be determined that a value closest to an input X is $2A_J$ of $2A_i$.

The magnitudes of the reference analog signals are halved to assume the values of complements with respect to X, $Y_i$ are given by equation (8):

$$Y_i = A_i\{X - (A_i/2)\} = -(\tfrac{1}{2})\cdot(A_i - X)^2 + X^2/2 \quad \ldots (8)$$

From equation (8), it can be determined that a value closest to an input X is $A_J$.

② In order to linearize detection signals (e.g., detection signals from a temperature sensor) using different correction formulas according to classes to which the detection signals belong, a correction element for selecting a predetermined correction formula according to an output from the neural network is added. When each reference analog signal is set to be an intermediate value of a corresponding class, the detection signals from the temperature sensor can be linearized by correction formulas corresponding to the class.

③ When different production rules are determined in units of classes according to the magnitudes of analog signals, and inference or control is made according to the rules, an inference-control element for selecting a predetermined production rule according to the output from the neural network is added. When each reference analog signal is set to be an intermediate value of a corresponding class, an analog signal is input to determine its class, and inference or control determined in correspondence with the class can be performed.

④ An element for receiving a bit pattern signal having a predetermined meaning, and converting the bit pattern signal assumed as a binary number into an analog signal is added. The analog output is input to a complement element as an unknown analog input signal. On the other hand, reference analog signals obtained by assuming reference bit patterns as binary numbers are input. With this arrangement, the reference bit pattern coinciding with the input bit pattern signal can be determined.

⑤ The above-mentioned "i" are defined as N-ary numbers $0, 1, \ldots, N-1$, and reference analog signal values are defined as values $A_i$ proportional to i as the arithmetic sequence. Thus, when an unknown analog input signal is input, it can be converted into an N-ary 1-digit digital signal in a fraction rounding mode upon sparkling of an artificial neuron.

If the reference analog signal is defined as a signal $(A_i + \Delta)$ obtained by adding, as a bias, a value $\Delta$ half (strictly speaking, slightly smaller than half) a minimum unit to a value proportional to i, an unknown analog signal can be converted into an N-ary 1-digit digital signal in a fraction omission mode.

When a reference analog signal generating element generates a signal $A_i$ proportional to i, a sum of this signal and a bias $\Delta$ is used in a complement element and a multiplication element.

⑥ M stages of elements for converting an input signal into an N-ary 1-digit digital signal in the fraction omission mode are connected through input pre-processing elements. The input pre-processing element of the next stage transmits, to a complement element of the next stage, a signal $N(X-A_J)$, as an unknown analog signal, obtained by subtracting a reference analog signal $A_J$ corresponding to J indicated by a artificial neuron, which sparks in a neural network of the immediately preceding stage, from an unknown analog input signal X input to a complement element of the immediately preceding stage, and multiplying N with the difference.

When a reference analog signal generating element transmits not the analog signal $A_J$ proportional to J but an analog signal $A_{J^*}(=A_J+\Delta)$, the input preprocessing element takes the bias $\Delta$ into consideration, and performs a calculation $N(X - A_{J^*} + \Delta)$ to output an unknown analog signal.

In this manner, a digital signal corresponding to a value at the next digit position of an N-ary number can be obtained upon sparking of a artificial neuron of a neural network of the next stage.

Assuming that an unknown analog signal is input to a complement element of the first stage, and $(J_1)$th, $(J_2)$th, $\ldots$, $(J_M)$th artificial neurons spark in neural networks of the first, second, $\ldots$, Mth stages, N-ary M-digit digital signals $J_1, J_2, \ldots, J_M$ can be obtained.

⑦ An element for converting an input signal into an N-ary 1-digit digital signal, a control-storage element for repetitively operating this element M times, and an input pre-processing element for generating a signal $N(X-A_J)$ as an unknown analog input signal in the next operation in the same manner as described above are used. Thus, a value at the most significant digit position obtained by converting an unknown analog input signal into an N-ary digital signal is determined in the first operation, and a value at the next digit position is determined in the next operation. Thus, the analog input signal can be converted into an N-ary M-digit digital signal.

Figure 16:
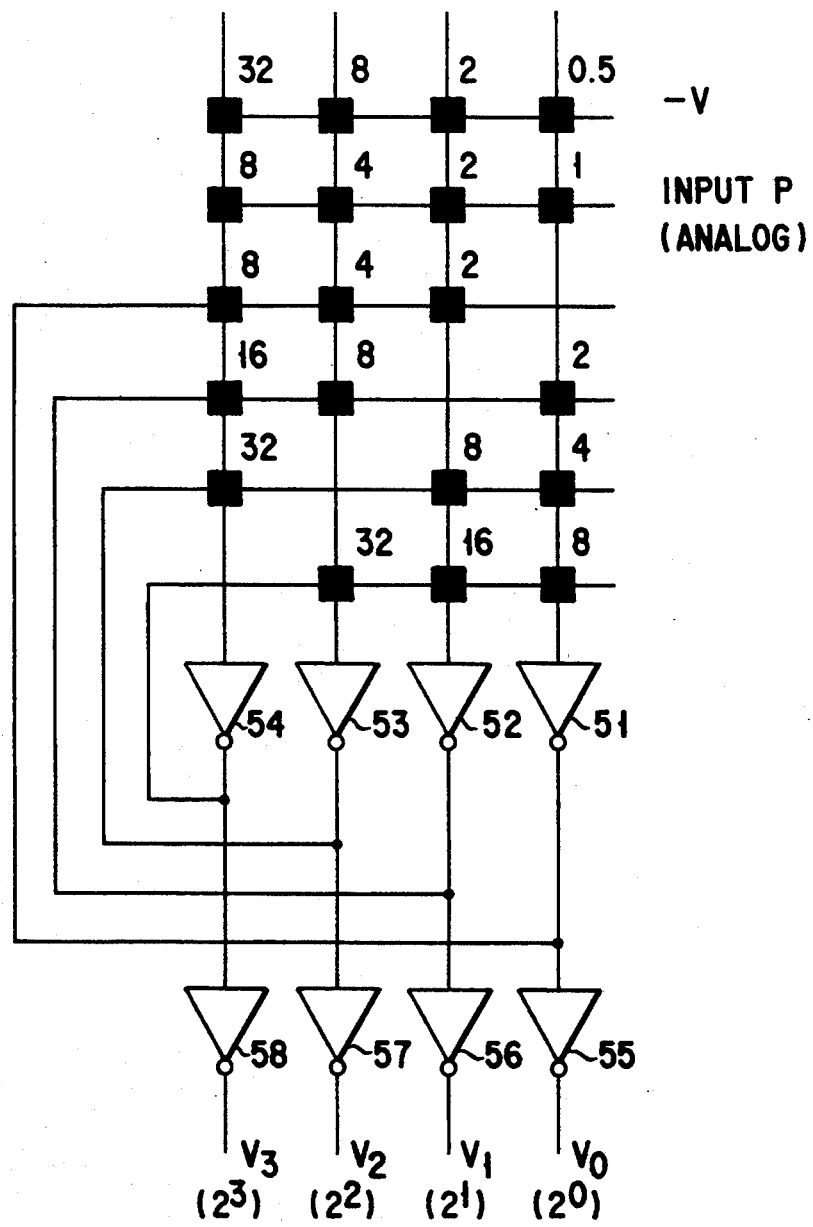
FIG. 16 is a block diagram of a neural network for binary 4-bit A/D conversion.

⑧ As a circuit for converting an analog signal into a binary digital signal using a neural network, a circuit shown in FIG. 16 is known.

In this circuit, an analog input voltage P is input to a neural network consisting of four artificial neurons, and a 4-bit digital value is presented according to the arrangement of outputs $V_0$ to $V_3$ from the neural network.

In this circuit, a synapse coupling value (the reciprocal number of a resistance) $Y_{ij}$ indicated by a black square mark between "i"th and "j"th artificial neurons, and an input value Ii including a bias to the "i"th artificial neuron are values uniquely determined by the following equations from the energy function.

$$T_{ij} = -2^{i+j} \quad \ldots (9)$$

$$I_i = (-2^{2i-1} + 2^i P) \quad \ldots (10)$$

Therefore, if K artificial neurons are used, a binary K-bit A/D converter, which can be operated in a half-adjust mode, can be constituted.

A signal having a magnitude $\frac{1}{2}$ (strictly speaking, slightly smaller than $\frac{1}{2}$) an analog signal corresponding to the least significant bit is represented by $\Delta$, and $(P-\Delta)$ is input in place of the above-mentioned analog input voltage P, thus constituting a binary K-bit A/D converter, which can be operated in a fraction omission mode.

Furthermore the digital signal A/D converted by this neural network is converted into an analog signal B by a D/A converter. An input preprocessing element generates a signal obtained by subtracting the analog signal B from the analog input voltage P, multiplying $2^K$ with the difference, and subtracting $\Delta$ from the product. This signal is then A/D-converted by the above-mentioned neural network. Thus, a fraction that is omitted as a value smaller than the least significant bit or equivalent can be further converted into a K-bit digital signal.

In this manner, the A/D converter for converting an input signal into a binary K-bit digital signal, the D/A converter for converting the output from the A/D converter into an analog signal, and the L stages of input preprocessing elements or a combination of one stage of input preprocessing element and the control-storage element for repetitively operating the input preprocessing element are arranged, thus obtaining the A/D converter apparatus for converting an analog input signal into a $2^K$-ary L-digit or binary K×L bit digital signal.

The first embodiment of a signal processing apparatus, which can realize the above-mentioned signal processing, will be described below with reference to FIG. 1.

The signal processing apparatus of the first embodiment comprises a suppression-mutual-coupling type neural network 1 shown in FIG. 14, a sense element 2 connected to the output terminals (amplifier output terminals) of the neural network 1, a reference analog signal generating element 3 for generating N reference analog signals $A_i$ (i=0, 1, ..., N-1), N complement elements 4.0, 4.1, ..., 4.N-1, and N multiplication elements 5.0, 5.1, ..., 5.N-1.

The neural network 1 consists of N neurons. N input terminals of the neural network are connected to the multiplication elements 5.0, 5.1, ..., 5.N-1, and N output terminals thereof are connected to the sense element 2. As described above, the neural network has a function of instantaneously determining a maximum one of N analog input signals, as described above. In this embodiment, the neuron, which receives the maximum input signal, outputs logic value "1".

The reference analog signal generating element 3 supplies N reference analog signals $A_i$ each having different signal values to the complement elements 4.0, 4.1, ..., 4.N-1, and the multiplication elements 5.0, 5.1, ..., 5.N-1.

Each of the complement elements 4.0, 4.1, ..., 4.N-1 operates as follows. That is, each complement element receives an unknown analog input signal X from an external circuit, and subtracts a corresponding reference analog signal $A_i$ from a value 2X twice the unknown analog input signal X so as to obtain a complement value. The output terminal of each of these complement elements 4.0, 4.1, ..., 4.N-1 is connected to one input terminal of a corresponding one of the multiplication elements 5.0, 5.1, ..., 5.N-1. Therefore, the complement values obtained by the complement elements 4.0, 4.1, ..., 4.N-1 are input to the corresponding multiplication elements 5.0, 5.1, ..., 5.N-1.

Each of the multiplication elements 5.0, 5.1, ..., 5.N-1 transmits, to the corresponding input terminal of the neural network 1, a value $Y_i$ ($=A_i(2X-A_i)$) obtained by multiplying the corresponding analog input signal $A_i$ from the reference analog signal generating element 3 with the complement value from the corresponding one of the complement elements 4.0, 4.1, ..., 4.N-1.

The sense element 2 has a function of determining an amplifier output of logic "1" of the neural network 1.

When this apparatus is operated upon reception of an unknown analog input signal X, in the neural network 1, an output $V_J$ of an amplifier, which receives a maximum input $Y_J$ (current value in this case) of inputs $Y_i$ (i=0, 1, ..., N-1), goes to logic "1" (equal to or higher than a reference level), and other amplifier outputs go to logic "0" (lower than the reference level). The sense element 2 detects an output of logic "1" from the outputs $V_0$ to $V_{N-1}$ of the neural network 1. The sense element 2 determines the detection number J as the maximum analog input number to the neural network 1. More specifically, the sense element 2 transmits the detection number J as a number of the reference analog signal $A_J$ closest to the unknown analog input signal X.

In this manner, according to the first embodiment, a reference signal, closest to an unknown analog input signal, of N reference analog signals can be determined by a single operation without repetitive operations. More specifically, high-speed clustering of an analog input can be executed.

As the complement elements 4.0, 4.1, ..., 4.N-1, elements for generating complement values ($X=A_i$) of $A_i$ with respect to X may be used in place of the complement values with respect to 2X.

In this case, since the number J corresponding to a reference analog signal $A_{J}$ closest to the value X/2 is selected, it is interpreted in practice that X is closest to $2A_{J}$. Alternatively, the reference analog signal generating element 3 generates a signal $a_i$ having a magnitude half that of a nominal value $A_i$. Thus, even when the complement elements 4.0, 4.1, ..., 4.N-1 comprise the elements for generating complement values of $a_i$ with respect to X, a nominal value $A_J$ closest to X can be detected.

The multiplication elements 5.0, 5.1, ..., 5.N-1 may perform the same operations as in the above embodiment by resistor elements $R_i$ (provided in advance) having resistances proportional to or inversely proportional to the values of the corresponding reference analog signals $A_i$ without receiving signals from the reference analog signal generating element 3. More specifically, when each multiplication element transmits a voltage signal V upon reception of a current signal I from the corresponding complement element, it may calculate V=RI as a calculation between a reference analog signal and a complement element signal. When each multiplication element transmits a current signal I upon reception of a voltage signal V from the corresponding complement element, it may calculate I=(1/R)·V as a calculation between a reference analog signal and a complement element signal.

Note that in the neural network shown in FIG. 14, input signals are current signals $Y_0, ..., Y_i, ..., Y_j, ..., Y_{N-1}$. However, the present invention can be similarly applied to a case wherein input signals are, e.g., voltage signals. In addition, the synapse coupling elements are not limited to the resistors.

In the first embodiment, the neural network is constituted by an analog circuit. For example, in place of the reference analog signals, corresponding digital signals may be used, and an unknown analog input signal may be converted into a digital signal by an A/D converter, so that the following processing may be executed by a digital arithmetic circuit.

In this case, the function of the neural network is carried out using an equation obtained by converting differential equation (1) into a difference equation.

Furthermore, the amplifier characteristics of the neural network are not limited to those shown in FIG. 14.

For example, the maximum saturation value of the amplifier output need not always be "1". In this case, a sense element for detecting a saturation value of the amplifier outputs is used. In addition, amplifiers having characteristics defined by a monotonous increasing function having no maximum saturation value in place of the sigmoid function shown in FIG. 15 may be used. In this case, a sense element for detecting a predetermined value of the amplifier outputs is used.

FIG. 2 shows the arrangement of a signal processing apparatus according to the second embodiment of the present invention.

This embodiment comprises a signal processing apparatus 10 shown in FIG. 1 described above, and a correction function conversion element 20.

The correction function conversion element 20 comprises N class correction function conversion elements 6.0, 6.1, ..., 6.N-1, and a relay element 21 for controlling supply of an unknown analog input signal X to these class correction function conversion elements.

The relay element 21 comprises a plurality of normally open contacts. One terminal of each normally open contact receives an unknown analog input terminal, and the other terminal thereof is connected to the corresponding class correction function conversion element. The relay element 21 closes an arbitrary contact according to a selection signal output from a sense element 2 of the signal processing apparatus 10. More specifically, the sense element 2 outputs a number of a neuron, which receives a reference analog signal closest to the unknown input signal in a neural network 1, and a contact equivalent to the corresponding reference analog signal is closed.

Figure 3:
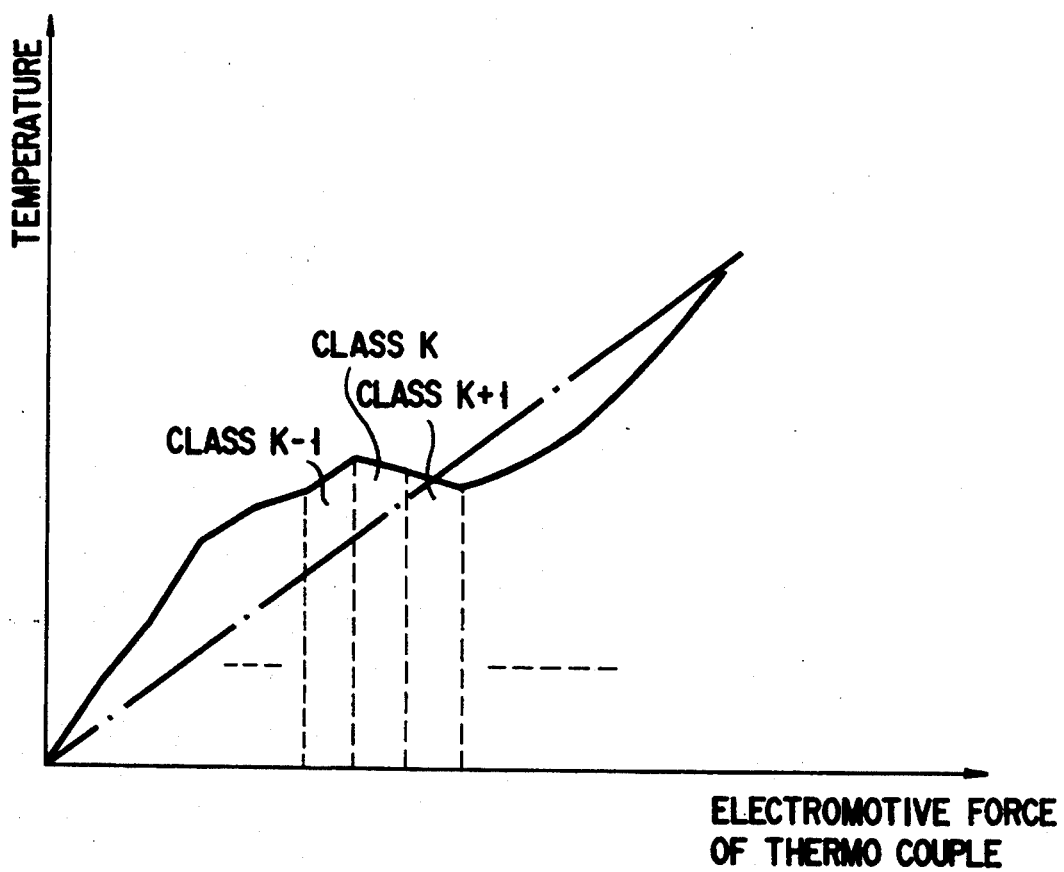
FIG. 3 is an explanatory view with correction function conversion using the second embodiment.

A signal output from a sensor such as a thermocouple or a temperature-measuring resistor does not have a fine linear relationship with a physical quantity such as an original temperature. More specifically, as shown in FIG. 3, a calibration curve representing the relationship between a sensor output and an original physical quantity is defined by a curve. For this reason, sensor outputs are classified according to their magnitudes, and the calibration curve is divided and approximated by polygonal approximation so as to linearize the sensor outputs using correction formulas in correspondence with classes, thereby measuring an original physical quantity.

In this embodiment, an unknown analog input signal X requiring linearization is received by the signal processing apparatus 10. When N reference analog input signals $A_i$ of the signal processing apparatus 10 are set to be intermediate values of the corresponding classes, only a artificial neuron, which receives a signal associated with a reference analog signal $A_J$ closest to the analog input signal X, sparks, and the corresponding amplifier output $V_J$ generates an output of logic "1". As a result, the sense element 2 transmits the number J of the corresponding reference analog signal.

The relay element 21 operates switching elements upon reception of the amplifier outputs $V_i$ (i=0, 1, ..., N-1) or the number J as the output from the sense element 2, so that the unknown analog input signal X is supplied to the "J"th class correction function conversion element 6.J. The "J"th class correction function conversion element 6.J performs, for the unknown analog input signal X, a correction function conversion calculation (e.g., aX+b (where a and b are coefficients) in the case of polygonal approximation) determined in a corresponding division, and the calculation result is determined as an output of the apparatus of this embodiment.

More specifically, when the apparatus according to this embodiment is used, an unknown analog input signal X need not be repetitively compared with boundary values of the respective classes to determine a class to which the analog input signal belongs. Therefore, a class can be determined instantaneously (strictly speaking, by an operation time constant of artificial neurons), and linearization is completed.

Therefore, the apparatus of this embodiment is particularly effective when temperatures at a large number of places in a plant must be accurately measured at a high speed.

Note that the apparatus of this embodiment is not limited to one for linearization, but may be used in an apparatus, which employs elements for performing function conversion determined by a steam table as the correction function conversion elements, and obtains an enthalpy value signal from a detected steam pressure analog signal.

Figure 4:
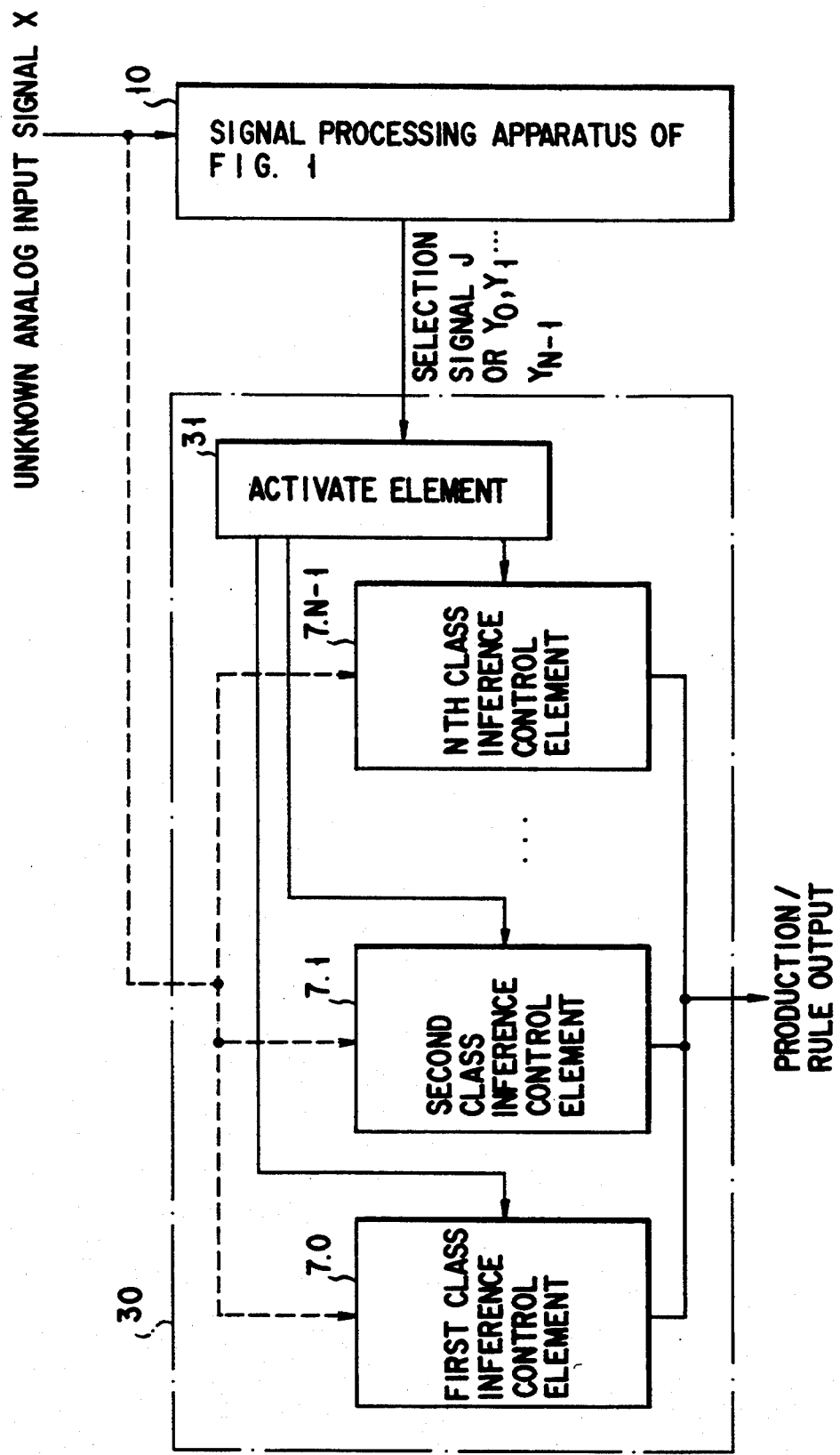
FIG. 4 is a block diagram of an arrangement used in inference-control according to the third embodiment of the present invention.

FIG. 4 shows the arrangement of a signal processing apparatus according to the third embodiment of the present invention.

This embodiment comprises N class inference-control elements 7.0, 7.1, ..., 7.N-1, an activate element 31 for activating these class inference-control elements, and a signal processing apparatus 10, whose detailed arrangement is shown in FIG. 1.

An expert system normally performs inference based on different production rules in correspondence with classes according to the magnitudes of analog signals. In some cases, operation amounts having magnitudes determined in units of classes are determined by a table look-up method, or operation amounts determined by a control algorithm are output to control a plant.

In this embodiment, N reference analog signals $A_i$ of the signal processing apparatus 10 are set to be intermediate values of the respective classes. An unknown analog input signal X is received by the signal processing apparatus 10 so as to spark only a artificial neuron, which receives a signal associated with a reference analog signal $A_J$ closest to the analog input signal X. An amplifier output $V_J$ corresponding to the sparking neuron generates an output of logic "1". A sense element 2 transmits a number J of a corresponding reference analog signal.

The activate element 31 of an inference-control element 30 activates the "J"th class inference-control element 7.J for a class corresponding to the unknown analog input signal X upon reception of the amplifier outputs $V_i$ (i=0, 1, ..., N-1) or the number J as the output from the sense element 2.

The "J"th class inference-control element 7.J transmits an inference result based on a production rule determined in correspondence with a class J, or an operation amount having a magnitude determined in correspondence with the class J, or an operation amount determined by a control algorithm determined in correspondence with the class J, as an output of the apparatus of this embodiment.

The class inference-control elements 7.0, 7.1, ..., 7.N-1 may receive and use an unknown analog input signal, as needed. More specifically, when this embodiment is employed, inference-control can be executed at a high speed without requiring clustering by conventional repetitive judgment operations. In particular, this embodiment is effective when the number of classes is large.

Figure 5:
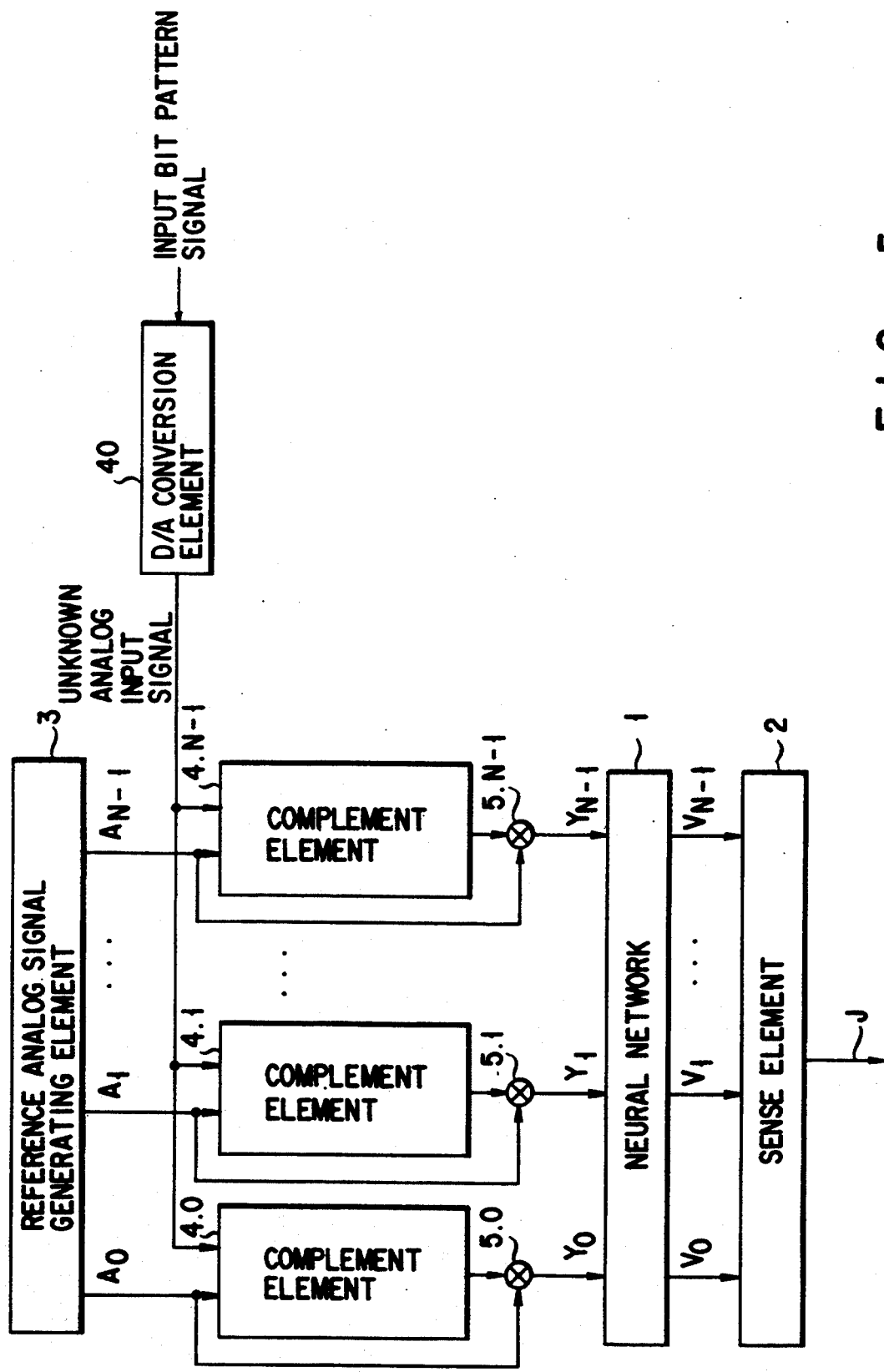
FIG. 5 is a block diagram of an arrangement used when pattern matching is performed according to the fourth embodiment of the present invention.

FIG. 5 shows the arrangement of a signal processing apparatus according to the fourth embodiment of the present invention.

This embodiment comprises a D/A conversion element 40 for converting an input bit pattern signal assumed as a binary number into an analog signal, and a signal processing apparatus 10, whose detailed arrangement is shown in FIG. 1, for receiving the output from the D/A conversion element 40 as an unknown analog input signal X.

In this embodiment, when an input bit pattern signal is input to the D/A conversion element 40, the element 40 converts the input bit pattern signal into an analog input signal X, and inputs the signal X to the signal processing apparatus 10.

In the signal processing apparatus 10, as described above, an amplifier output corresponding to an artificial neuron, which receives a signal associated with a reference analog signal AJ having a magnitude coinciding with that of the unknown analog input signal X, goes to logic "1", and a sense element 2 transmits its number J. More specifically, this number J means a number of a reference bit pattern signal coinciding with the input bit pattern signal.

Therefore, when this embodiment is employed, the meaning of an input bit pattern signal can be instantaneously detected without repeating collation with reference bit pattern signals. Furthermore, the apparatus of this embodiment may be connected to the inference-control element 30 shown in FIG. 4. In this case, when a parameter of a production rule is a bit pattern symbol, a predetermined production rule can be instantaneously started to perform inference-control.

Figure 6A:
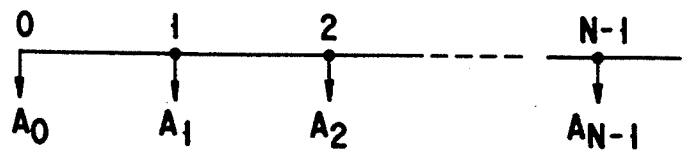
FIGS. 6A and 6B are explanatory views showing the relationship between an N-ary number and a reference analog signal.
Figure 6B:
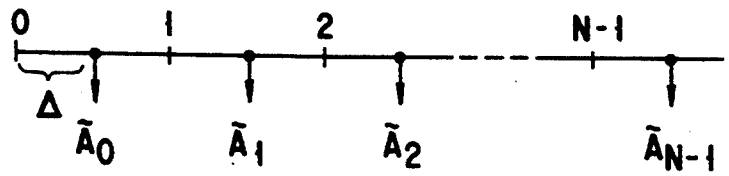

FIGS. 6A and 6B show output formats of reference analog signals generated by the reference analog signal generating element (denoted by reference numeral 3 in FIG. 1).

FIG. 6A shows a case for generating N values in the relationship of an arithmetic sequence proportional to signal numbers (nominal values, N-ary 1-digit value) i ($i=0, 1, \ldots, N-1$). In this case, assume that $A_0=0$. The reference analog signals set in this manner are generated by the analog signal generating element 3 shown in, e.g., FIG. 1, and an unknown analog input signal X is input to the signal processing apparatus 10. Then, the neural network 1 is immediately operated, and an amplifier output corresponding to only a artificial neuron, which receives a signal associated with a reference analog signal $A_J$ closest to the unknown analog input signal X, goes to logic "1". The sense element 2 detects the artificial neuron in the state of logic "1", and outputs its number J. The output J means an N-ary 1-digit numerical value J. More specifically, when the reference analog signals are set, as shown in FIG. 6A, an A/D converter for converting an analog signal into an N-ary 1-digit digital signal at high speed in the fraction-half-adjust mode without performing repetitive operations is realized.

As shown in FIG. 6B, the reference analog signal generating element 3 may generate $\tilde{A}_i = A_i + \Delta$ obtained by adding a value $\Delta$ half (strictly speaking, slightly smaller than a half value) an analog signal corresponding to one unit of an N-ary 1-digit digital signal to values $A_i$ proportional to signal numbers i. In this case, a high-speed A/D converter for converting an analog signal into an N-ary 1-digit digital signal in the fraction omission mode is realized.

The reference analog signal generating element 3 may be limited to one for generating values $A_i$ proportional to signal numbers i. In this case, a bias $\Delta$ may be separately added to the signals from the element 3, and sum signals may be supplied to the complement elements 4.0, 4.1, ..., 4.N-1 and the multiplication elements 5.0, 5.1, ..., 5.N-1. Alternatively, the complement elements and the multiplication elements may add the bias $\Delta$ to signals $A_i$ therein. With these arrangements, a high-speed A/D converter having the same effect as described above can be realized.

An A/D converter of this type is suitable for a constituting element of an A/D converter for further A/D-converting a fraction to obtain a lower-digit digital signal.

Since the suppression-mutual-coupling type neural network 1 used in the above-mentioned apparatuses detects a maximum value, synapse coupling resistors need only have resistances, which are almost equal to each other, and do not require high precision. For this reason, the following advantage can be provided. That is, if the neural network is used in A/D conversion for obtaining a digital signal having large N, it can be easily realized by LSIs.

Figure 8:
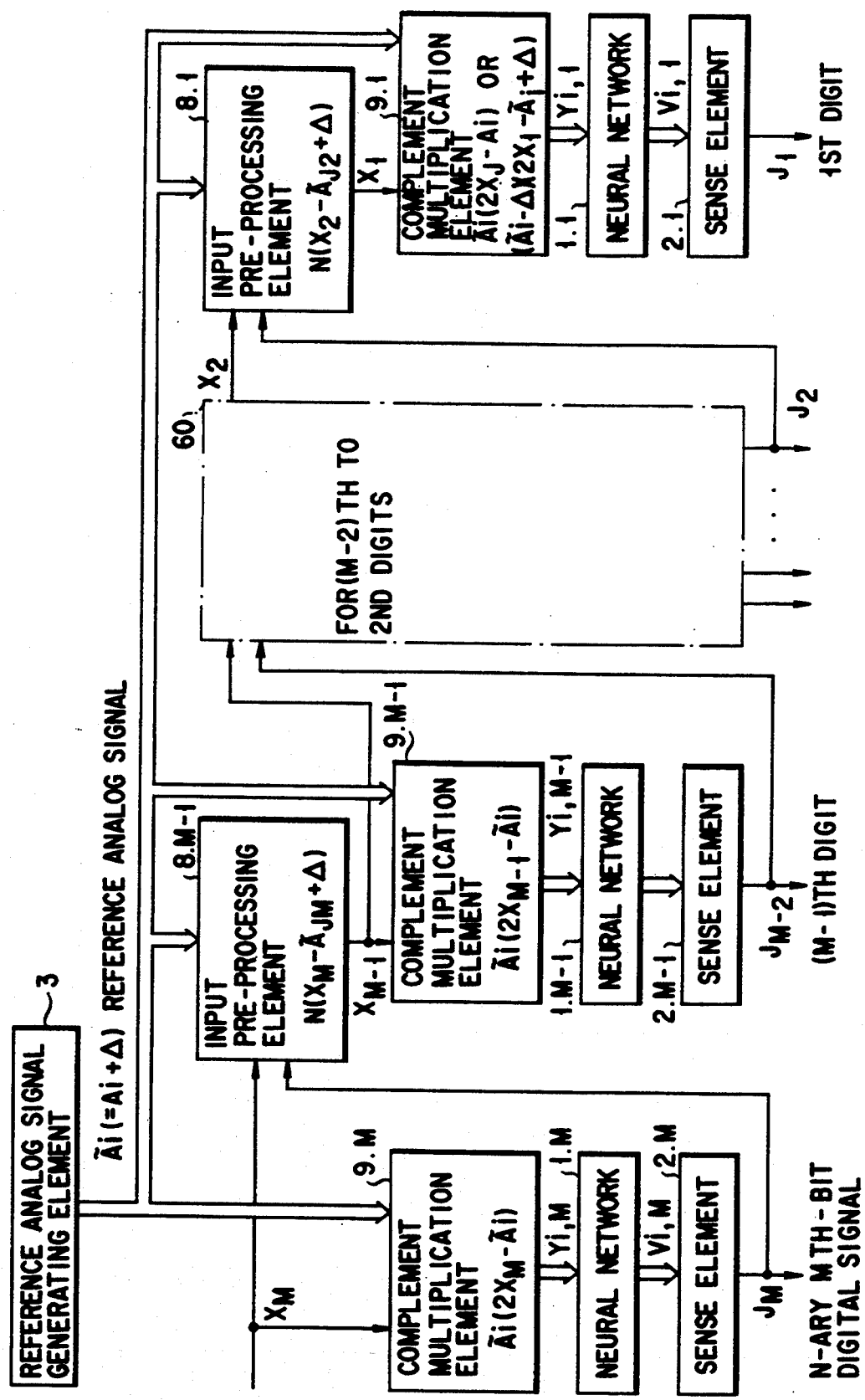
FIG. 8 is a block diagram showing an arrangement for N-ary M-digit A/D conversion according to the fifth embodiment of the present invention.

FIG. 8 shows the arrangement of a signal processing apparatus according to the fifth embodiment of the present invention.

This embodiment comprises a reference analog signal generating element 3, N complement multiplication elements 9.M, 9.M-1, ..., 9.1, M neural networks 1.M, 1.M-1, ..., 1.1, M sense elements 2.M, 2.M-1, ..., 2.1, and (M-1) input preprocessing elements 8.M-1, 8.M-2, ..., 8.1.

In this embodiment, the reference analog signal generating element 3 is an element for generating N reference analog signals $\tilde{A}_i = A_i + \Delta$, which are obtained by adding a value $\Delta$ half (strictly speaking, slightly smaller than a half value) an analog value corresponding to one unit of an N-ary 1-digit digital signal to signals $A_i$ ($i=0, 1, \ldots, N-1$, $A_0=0$) having signal values proportional to signal numbers (nominal values, N-ary 1-digit values) i, and have the relationship of an arithmetic sequence.

The complement multiplication elements 9.M, 9.M-1, ..., 9.1 comprise elements for receiving (unknown) analog input signals $X_M, X_{M-1}, \ldots, X_1$, and the reference analog signals $\tilde{A}_i$, and generating complements $2X_m - \tilde{A}_i$ of the reference analog signals $\tilde{A}_i$ ($i=1, 0, \ldots, N-1$) with respect to doubled analog input signals $2X_m$ ($m=M, M-1, \ldots, 1$), and multiplication elements for multiplying these outputs with the corresponding $\tilde{A}_i$ to obtain signals $Y_{i,m} = \tilde{A}_i(2X_m - \tilde{A}_i)$, and supplying these signals to the corresponding input terminals of the corresponding neural networks 1.M, 1.M-1, ..., 1.1.

Note that when a fraction is half-adjust at the N-ary least significant digit position, the final-digit complement multiplication element 9.1 comprises an element for generating a signal $(\tilde{A}_i-\Delta)(2X_i-A_i+\Delta)$ taking $\Delta$ into consideration.

Each of the neural networks 1.M, 1.M-1, ..., 1.1 is the same as that shown in FIG. 14, is of suppression-mutual-coupling type, and has a function of detecting a maximum one of signals input to its N input terminals.

The sense elements 2.M, 2.M-1, ..., 2.1 detect amplifier outputs $V_{i,m}$ (m=M, M-1, ..., 1) of logic "1" from artificial neurons in the neural networks 1.M, 1.M-1, ..., 1.1, and output corresponding numbers, i.e., N-ary numbers $J_M$, $J_{M-1}$, ..., $J_1$ converted into digital values.

Figure 7:
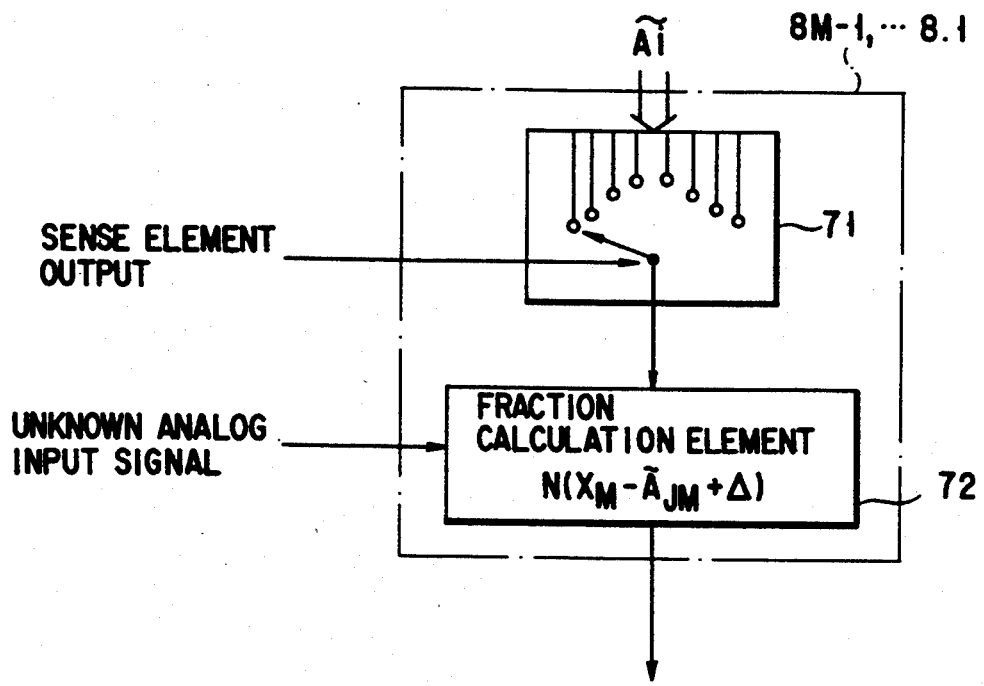
FIG. 7 is a block diagram showing an arrangement for input pre-processing element using the fifth embodiment.

The input preprocessing element 8.M-1 for processing an (M-1)th digit has an arrangement, as shown in FIG. 7. More specifically, the input preprocessing element 8.M-1 comprises a selection element 71 for receiving an N-ary 1-digit digital signal $J_m$ transmitted from the sense element 2.M, and selecting a reference analog signal $\tilde{A}_{Jm}$ corresponding to $J_m$, and a fraction calculation element 72 for receiving this output signal $\tilde{A}_{Jm}$, and an unknown analog input signal $X_m$, performing a calculation $N(X_m-\tilde{A}_{Jm}+\Delta)$, and outputting the calculation result as an unknown analog input signal $X_{m-1}$ to the complement multiplication element 9.M-1 for this digit.

Other input preprocessing elements 8.M-2, ..., 8.1 have the same arrangement as shown in FIG. 7. More specifically, each of these input preprocessing elements comprises a selection element for receiving an N-ary 1-digit digital signal $J_m$ transmitted from the sense element 2.m (m=M-1, ..., 2) for an upper neighboring digit of an N-ary number, and selecting a reference analog signal $\tilde{A}_{Jm}$ corresponding to $J_m$, and a fraction calculation element for receiving this output signal $\tilde{A}_{jm}$, and a (second unknown) analog input signal $X_m$ to be supplied to the complement multiplication element for an upper neighboring digit of an N-ary number, performing a calculation $N(X_m-\tilde{A}_{Jm}+\Delta)$, and outputting the calculation result as a (second unknown) analog input signal $X_{m-1}$ to the complement-multiplication element for this digit.

When an unknown analog input signal $X_M$ is input to this apparatus, the complement multiplication element 9.M calculates a complement value of a reference analog signal $\tilde{A}_i$ with respect to $2X_M$, multiplies the complement value with $A_i$, and transmits signals $Y_{i,M}$ ($=\tilde{A}_i(2X_M-\tilde{A}_i)$), i=0, 1, ..., N-1). The neural network 1.M receives the signals $Y_{i,M}$ at its corresponding input terminals, and operates in a mode for minimizing energy. Thus, only an amplifier output $V_{JM,M}$ of a $(J_M)$th artificial neuron, which receives a signal having a maximum magnitude of the signals $Y_{i,M}$, goes to logic "1".

The sense element 2.M detects the amplifier output $V_{JM,M}$ of logic "1", and transmits a numerical value $J_M$ at the most significant (Mth) digit position obtained by converting the unknown analog input signal into an N-ary digital signal according to the number of the detected output.

The signal $J_M$ is supplied to the input preprocessing element 8.M-1 for the (M-1)th digit, and is also used for selecting a $(J_M)$th reference analog signal $\tilde{A}_{JM}$. The input preprocessing element 8.M-1 subtracts $\tilde{A}_{JM}$ from the unknown analog input signal $X_M$, adds a bias $\Delta$ to the difference, and multiplies the sum signal with N (N is one for an N-ary number), thereby generating an (unknown) analog input signal $X_{n-1}$ to be supplied to the complement multiplication element 9.M-1 for the (M-1)th digit. More specifically, this processing is input processing for multiplying a value processed as a fraction in Mth-digit digital conversion of the unknown analog input signal $X_M$ with N, and obtaining an N-ary (M-1)th-digit digital signal using the same elements as those used in the Mth-digit digital conversion.

The complement multiplication element 9.M-1 for the (M-1)th digit receives this (unknown) analog input signal $X_{M-1}$, and the reference analog signals $A_i$, and transmits signals $Y_{i,M-1}$. The neural network 1.M-1 is operated upon reception of these signals $Y_{i,M-1}$, and an amplifier output, which receives a maximum input $Y_{JM-1,M-1}$ of the signals $Y_{i,M-1}$, goes to logic "1". The sense element 2.M-1 detects the amplifier output of logic "1", and transmits, as a digital signal, a numerical value $J_{M-1}$ at the next ((M-1)th) digit position obtained by converting an analog input signal of a fraction at the Mth-digit position into an N-ary number.

The same processing is repeated up to the first digit position. In this manner, signals $J_M$, $J_{M-1}$, ..., $J_1$ obtained by converting original unknown analog input signals $X_M$ into N-ary M-digit digital signals are obtained. When the complement multiplication element 9.1 for the least significant digit position employs an element for performing a calculation $(\tilde{A}_i-\Delta(2X_i-\tilde{A}_i+\Delta)$, a value $J_1$ at the least significant digit position becomes a value obtained in the fraction rounding mode.

In this manner, since the apparatus of this embodiment does not require repetitive operations, an analog signal can be converted into N-ary M-digit digital signals instantaneously (strictly speaking, within a time M times an operation time constant $\tau$ of artificial neurons). Therefore, this apparatus is suitable for a case requiring high-speed, high-precision A/D conversion. Since the neural networks for detecting a maximum value are used, high-precision A/D conversion can be realized without using high-precision resistors as synapse coupling resistors. Therefore, the apparatus of this embodiment is suitable for the LSI arrangement.

Figure 9:
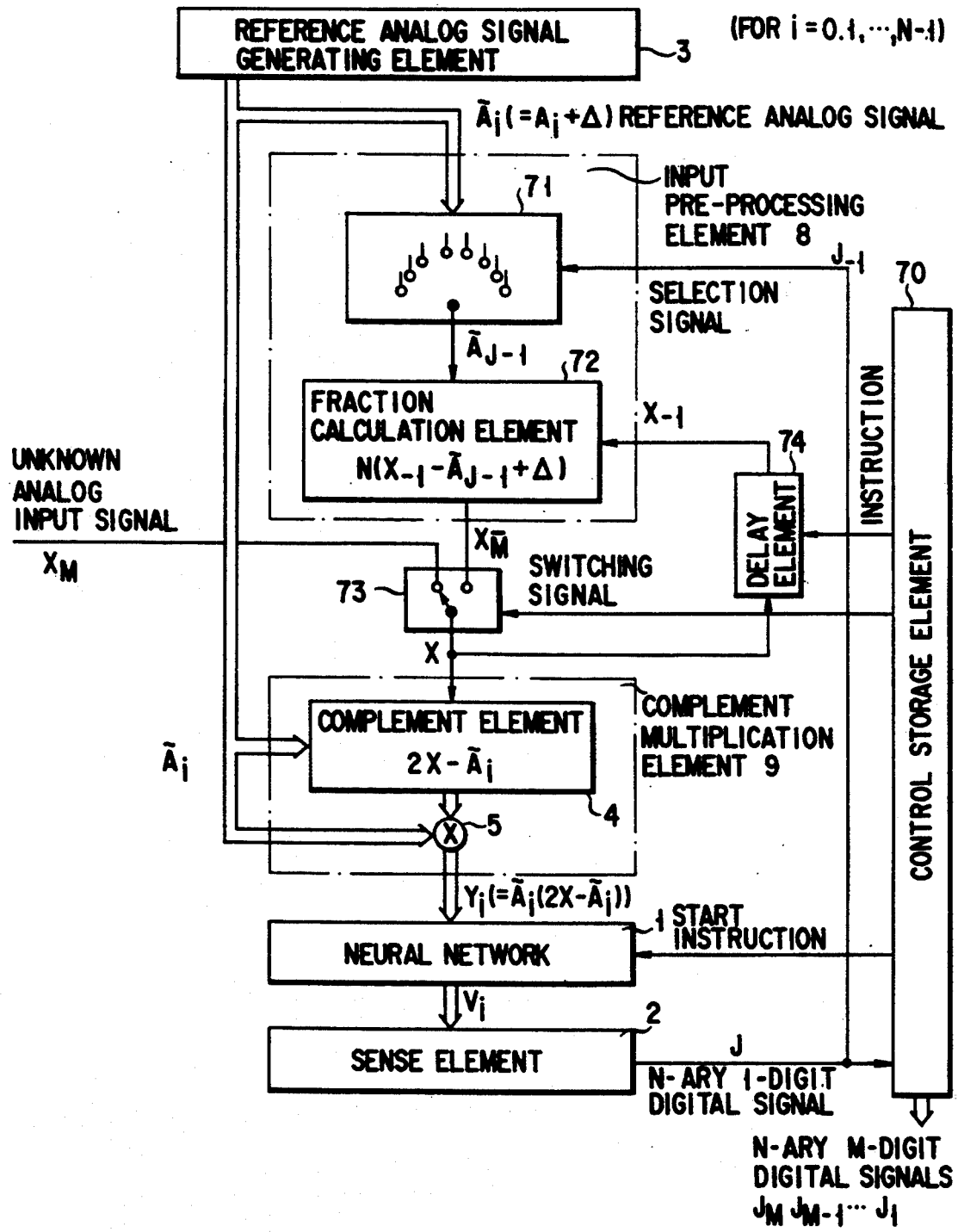
FIG. 9 is a block diagram showing another arrangement for N-ary M-digit A/D conversion according to the sixth embodiment of the present invention.

FIG. 9 shows the arrangement of a signal processing apparatus according to the sixth embodiment of the present invention.

This embodiment comprises a reference analog signal generating element 3, an input pre-processing element 8 constituted by a selection element 71 and a fraction calculation element 72, a switching element 73, a complement multiplication element 9 constituted by a complement element 4 and a multiplication element 5, a neural network 1, a sense element 2, a delay element 74, and a control-storage element 70.

The switching element 73 receives an unknown analog input signal $X_M$, and an output $X_{\overline{M}}$ from the fraction calculation element 72. The element 73 selects an unknown analog input signal $X_M$ in the first operation, and selects $X_{\overline{M}}$ in the second and subsequent operations, in accordance with a switching signal from the control-storage element 70. The element 73 transmits the selected output to the complement multiplication element 9 as an analog input signal X.

The delay element 74 holds the output X from the switching element 73, and outputs the held output X as an analog input signal $X_{-1}$ of an immediately preceding operation to the fraction calculation element 72 in the next operation in accordance with an instruction from the control-storage element 70.

Figure 10:
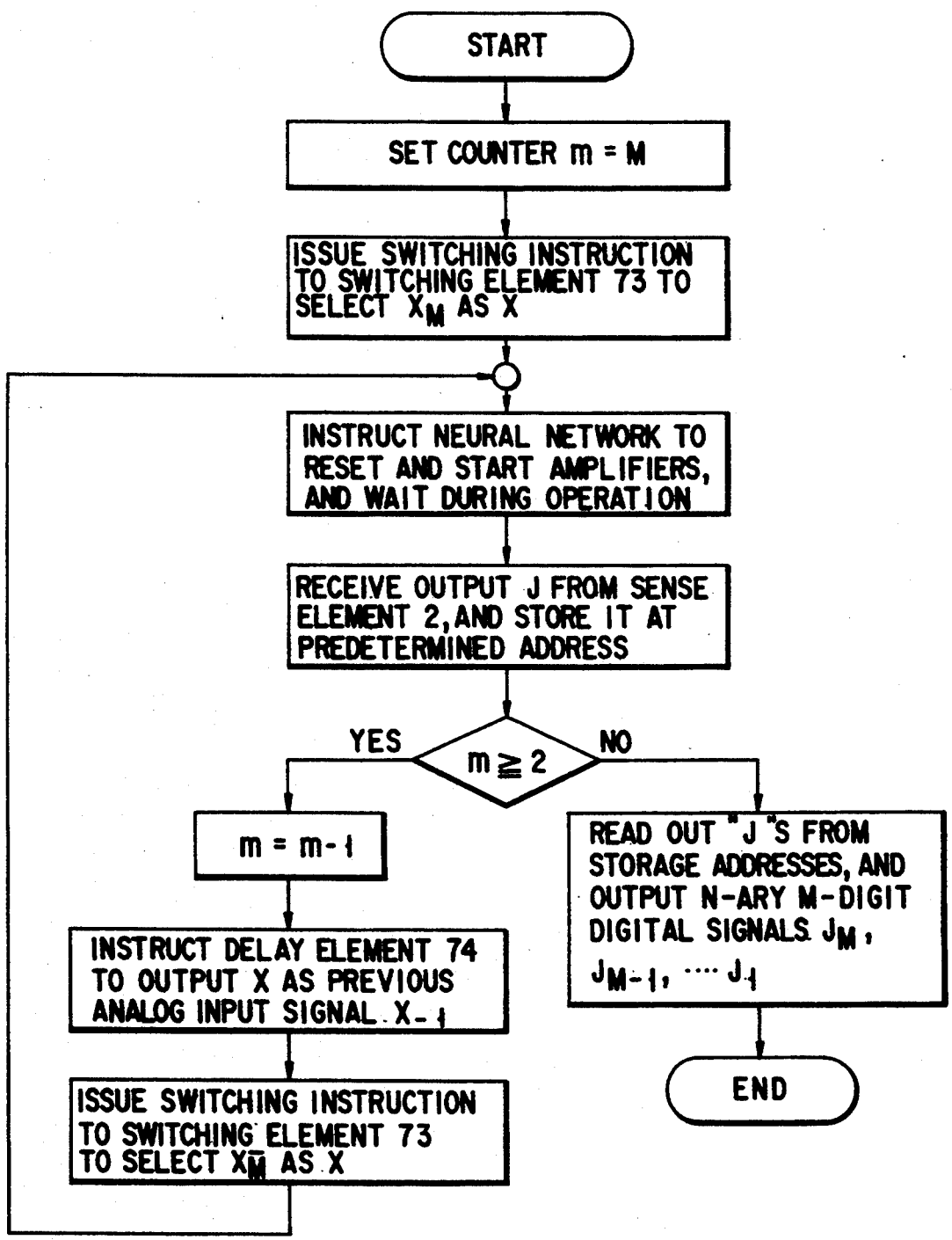
FIG. 10 is a flow chart showing an operation of a control-storage element in FIG. 9.

The control-storage element 70 outputs a switching instruction to the switching element 73, instructs the neural network 1 to reset and start, and receives and stores a digital signal J from the sense element 2. Furthermore, the element 70 issues an instruction to the delay element 74, and to transmit N-ary M-digit digital signals as outputs of the apparatus of this embodiment. The flow chart of FIG. 10 shows the principal operation of the control-storage element 70.

Since the reference analog signal generating element 3, the input pre-processing element 8, the complement multiplication element 9, the neural network 1, and the sense element 2 are the same as those described above, a detailed description thereof will be omitted.

When an unknown analog input signal $X_M$ is input to the apparatus of this embodiment, the unknown analog input signal $x_M$ is input to the complement multiplication element 9 as a signal X through the switching element 73.

The complement multiplication element 9 also receives reference analog signals $\bar{A}_i$ (i=0, 1, ..., N-1), and performs calculations $\bar{A}_i(2X-\bar{A}_i)$. The element 9 outputs the calculation results as signals $Y_i$ to the neural network 1.

The neural network 1 resets its amplifiers in response to an instruction from the control-storage element 70, and thereafter, is operated upon reception of the signals $Y_i$ at the corresponding input terminals. Thus, only an amplifier output $V_J$ of a artificial neuron, which receives a maximum one of the signals $Y_i$, goes to logic "1".

The sense element 2 detects the amplifier output of logic "1", and transmits its number, i.e., an N-ary 1-digit digital signal J to the control-storage element 70 and the selection element 71.

The control-storage element 70 stores the digital signal J at a storage address for an N-ary most significant (Mth) digit as a signal $J_M$. The selection element 71 uses the digital signal J transmitted from the sense element 2 as a selection signal $J_{-1}$, selects a signal $\bar{A}_{J-1}$ at a $(J_{-1})$th of the reference analog signals $\bar{A}_i$, and transmits the selected signal to the fraction calculation element 72. At the same time, the delay element 74 transmits the analog input signal X as an analog input signal $X_{-1}$ of an immediately preceding operation to the fraction calculation element 72 upon reception of an instruction from the control-storage element 70.

The fraction calculation element 72 performs a calculation $N(X_{-1}-\bar{A}_{J-1}+\Delta)$ upon reception of the signal $\bar{A}_{J-1}$ and the signal $X_{-1}$, and transmits, as a current a input signal $X_M$, a signal obtained by multiplying an analog signal, which is ignored as a fraction in immediately preceding digital conversion of an analog signal with N, to the switching element 73. Thereafter, the switching element 73 transmits the signal $X_M$ as a signal X to the complement multiplication element 9 and the delay element 74 in response to a switching instruction from the control-storage element 70.

The complement multiplication element 9, the neural network 1, and the sense element 2 operate in the same manner as in the immediately preceding operation, thus transmitting a digital signal J. The control-storage element 70 receives this signal J, and stores it as a signal $J_{M-1}$ at a storage address for an N-ary (M-1)th digit. The above-mentioned operations are repeated until a digital signal of the least significant (first) digit is obtained, and N-ary M-digit digital signals $J_M, J_{M-1}, \ldots, J_1$ stored in the control-storage element 70 are transmitted as outputs of the apparatus of this embodiment.

According to this embodiment, the same function as in the fifth embodiment can be realized by using a single neural network.

Note that the operation time of this embodiment includes a time required for an operation in the control-storage element 70. However, if the control-storage element 70 comprises a high-speed element, sufficiently high-speed A/D conversion can be realized.

Figure 11:
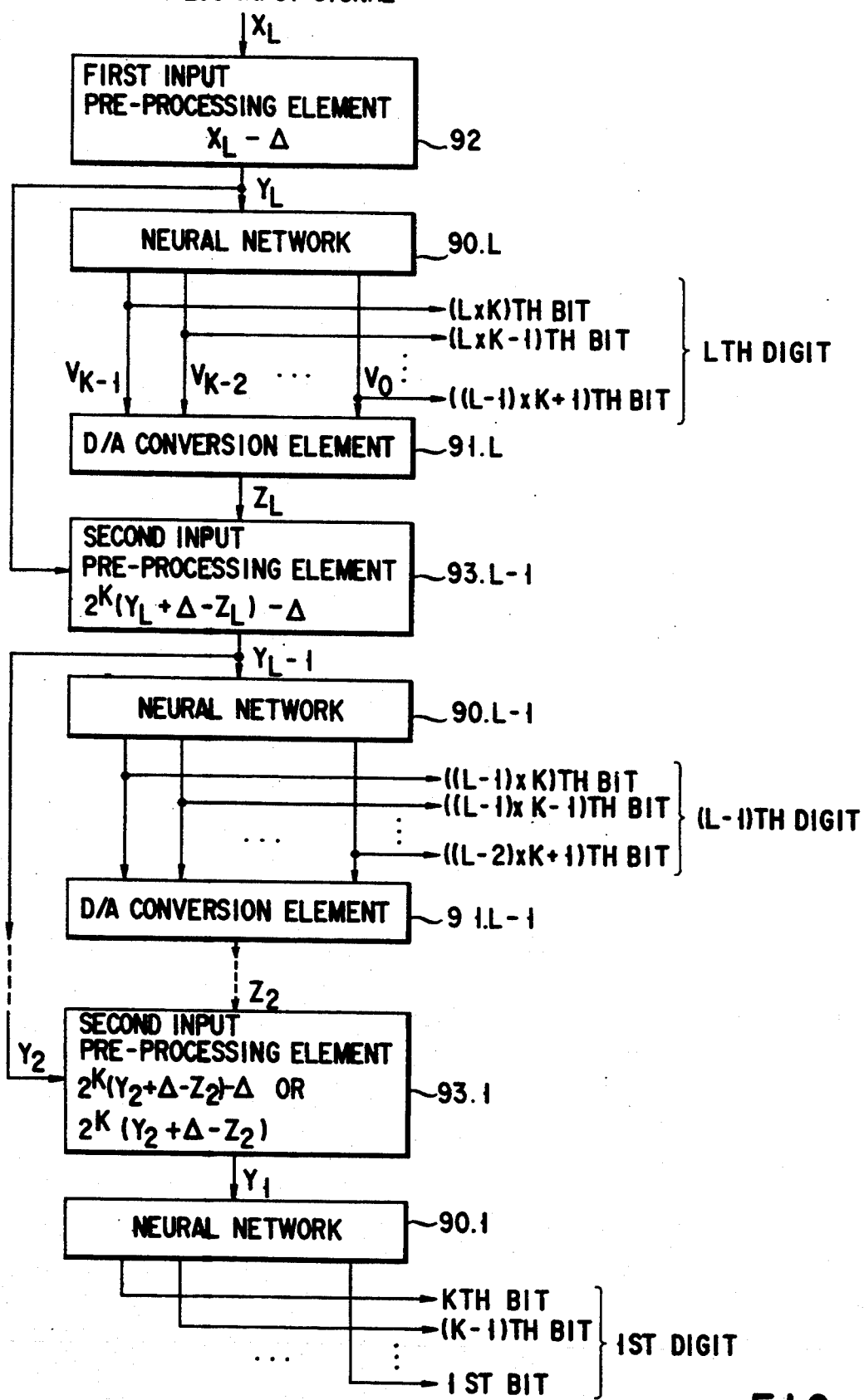
FIG. 11 is a block diagram showing an arrangement for $2^K$-ary L-digit (binary K×L bit) A/D conversion according to the seventh embodiment of the present invention.

FIG. 11 shows the arrangement of a signal processing apparatus according to the seventh embodiment of the present invention.

This embodiment comprises L neural networks 90.L, 90.L-1, ..., 90.1 (a neural network of a type shown in FIG. 16), L-1 D/A conversion elements 91.L, 91.L-1, ..., 91.2, a first input preprocessing element 92, and L-1 second preprocessing elements 93.L-1, 93.L-2, ..., 93.1.

The neural networks 90.L, 90.L-1, ..., 90.1 have a function of rounding fractions generated upon A/D conversion of the analog input signal Y and converting the input signal into a binary K-bit digital signal.

The D/A conversion elements 91.L, 91.L-1, ..., 91.2 are elements for converting binary K-bit outputs from the corresponding neural networks 90.L, 90.L-1, ..., 90.2 into 1st-digit analog signals $Z_{hd\,l}$ (l=L, L-1, ..., 2).

The first input pre-processing element 92 receives an unknown analog input signal $X_L$, and subtracts, from the analog input signal, a small amount $\Delta$ half (strictly speaking, a value slightly smaller than half) an analog amount corresponding to the least significant bit of the neural network outputs, so as to obtain a signal $Y_L$. The element 92 transmits the signal $Y_L$ to the neural network 90.L, and the second input preprocessing element 93.L-1.

The second input preprocessing elements 93.L-1, 93.L-2, ..., 93.1 receive input signals Yl (l=L, L-1, ..., 2) to the neural networks for previous digits, and the outputs $Z_l$ from the D/A conversion elements, and perform calculations $2^K(Y_l+\Delta-Z_l)-\Delta$. The input pre-processing elements output the calculation results as signals $Y_{l-1}$ (l=L, L-1, ..., 2) to the neural networks 90.L-1, 90.L-2, ..., 90.1.

Note that in some cases, the second input preprocessing element 93.1 for the final digit may comprise an element for performing a calculation $2^K(Y_2+\Delta-Z_2)$ in place of a calculation $2^K(Y_2+\Delta-Z_2)-\Delta$.

When an unknown analog input signal $X_L$ is input to the apparatus of this embodiment, it is received by the first input pre-processing element 92, and the above-mentioned $\Delta$ is subtracted from the signal $X_L$ to obtain a signal $Y_L$. The signal $Y_L$ is output to the neural network 90.L and the second input pre-processing element 93.L-1.

This is to A/D-convert an input signal in the fraction omission mode although the neural networks 90 for A/D converting a fraction in the half-adjust mode are used. The neural network 90.L is operated upon reception of the signal $Y_L$. The neural network transmits binary K-bit signals $V_{K-1}, V_{K-2}, \ldots, V_0$ of the $2^K$-ary most significant digit (Lth digit) obtained by A/D-converting the original analog input signal $X_L$ in the fraction omission mode to an external apparatus as some of outputs of the apparatus of this embodiment, and also transmits these signals to the D/A conversion element 91.L. The D/A conversion element 91.L converts these signals into an analog signal, and transmits the analog signal as an Lth-digit analog signal $Z_L$ to the second input preprocessing element 93.L−1.

The second input pre-processing element 93.L-1 obtains a non-A/D-converted fraction $(Y_L+\Delta-Z_L)$ of the unknown analog input signal $X_L$ first, and multiplies it with $2^K$ to set a signal level that can be processed by the neural network 90.L-1 having the same arrangement as the above-mentioned Lth-digit neural network 90.L. Furthermore, the element 93.L-1 subtracts $\Delta$ from the above-mentioned signal, so that the signal can be A/D-converted in the fraction omission mode. Thereafter, the element 93.L-1 transmits the signal as a signal $Y_{L-1}$ to the (L-1)th-digit neural network 90.L-1, and the (L-2)th-digit second input preprocessing element 93.L-2.

The (L-1)th-digit neural network 90.L-1 is operated upon reception of the signal $Y_{L-1}$. The neural network converts an analog signal, which was omitted as a fraction in Lth-digit A/D conversion, into a digital signal, and transmits binary K-bit signals at the $2^K$-ary (L-1)th-digit position to an external apparatus, and the D/A conversion element 91.L-1. Thereafter, the same operations as described above are repeated. When the 1st-digit neural network 90.1 outputs binary K-bit digital outputs at the $2^K$-ary 1st-digit position, the apparatus of this embodiments ends its operations. When the $2^K$-ary 1st digit is to be A/D-converted in the fraction rounding mode, the 1st-digit second input pre-processing element 93.1 may comprise an element for performing a calculation $2^K(Y_2+\Delta-Z_2)$.

In order to perform A/D conversion with a resolution of 12 bits or more required in the process instrumentation control fields using a conventional A/D conversion neural network, resistors whose resistances have a resolution of $2^{11+10}=2^{21}$ according to equation (9) are required as the synapse coupling resistors, and it is difficult to realize an A/D converter.

In contrast to this, in the apparatus of this embodiment, the number of bits of A/D conversion executed in a single neural network can be suppressed to the number K of bits, which can be realized by resistors whose resolution can also be realized by LSIs. Therefore, the apparatus of this embodiment can enjoy high-speed A/D conversion using L neural networks, and great practical advantages.

FIG. 12 shows the arrangement of a signal processing apparatus according to the eighth embodiment of the present invention.

This embodiment comprises a neural network 90 (of a type shown in FIG. 16), a D/A conversion element 91, a first input pre-processing element 92, a second input pre-processing element 93, a switching element 94, a delay element 95, and a control-storage element 96.

The switching element 94 selects an output $Y_L$ from the first input pre-processing element 92 in the first operation, and selects an output $Y_L$ from the second input pre-processing element 93 in the second and subsequent operations. The switching element 94 transmits the selected signal as a signal Y to the neural network 90 and the delay element 95.

The delay element 95 holds the output signal Y from the switching element 94, and transmits the held signal as a signal $Y_{-1}$ to the second input preprocessing element 93 in the next operation in response to an instruction from the control-storage element 96.

Figure 13:
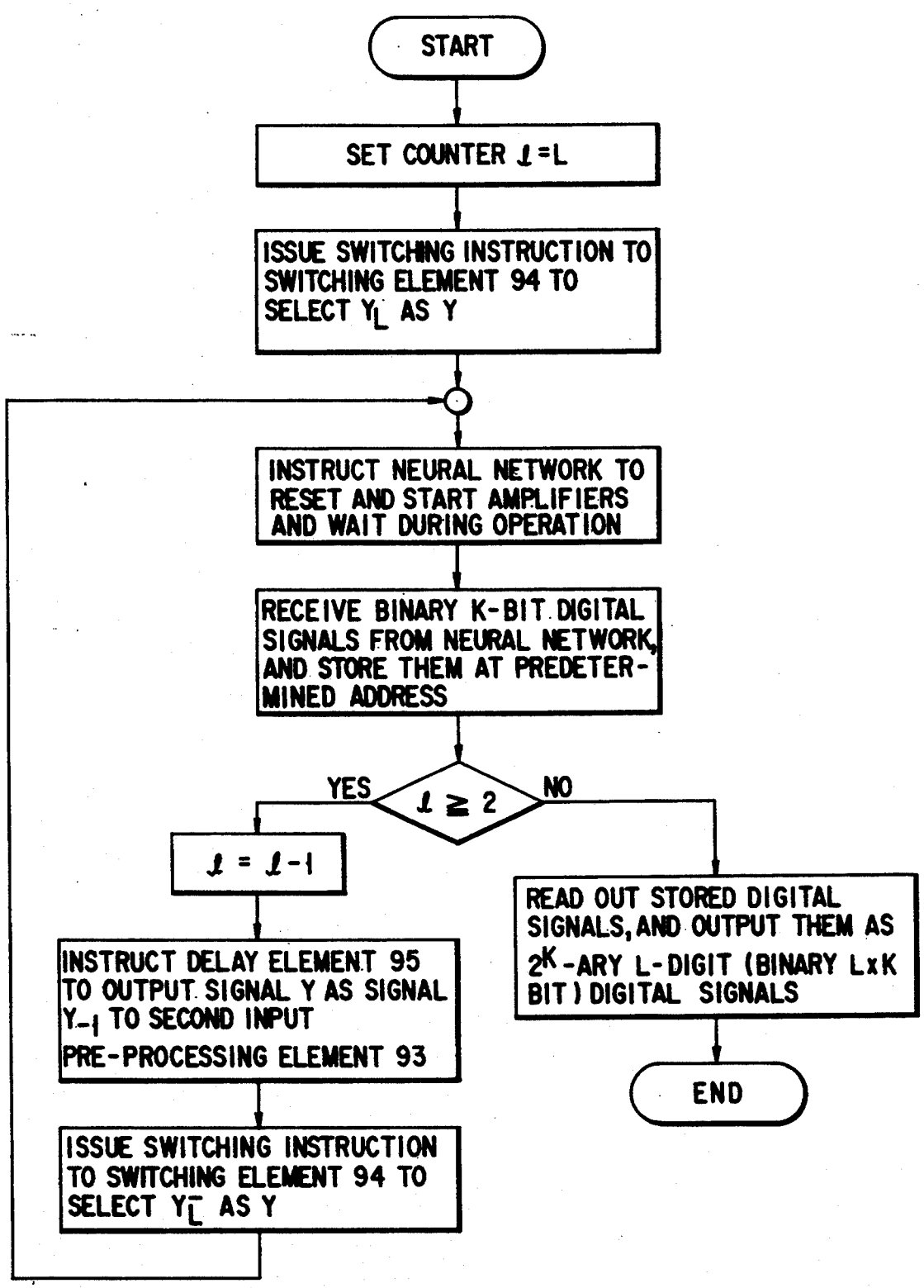
FIG. 13 is a flow chart showing an operation of a control-storage element in the embodiment shown in FIG. 12.

The control-storage element 96 instructs a switching operation of the switching element 94, instructs the neural network to reset and start amplifiers, and also instructs the delay element 95 to transmit held data Y to the second input pre-processing element 93. Furthermore, the control-storage element 96 receives $2^K$-ary 1-digit (binary K-bit) digital signals output in each operation of the neural network 90, and stores them at a predetermined address. When the control-storage element 96 receives $2^K$-ary 1st-digit digital signals, it outputs them as $2^K$-ary L-digit (binary K×L bit) digital signals. The principal function of this element is shown in the flow chart of FIG. 13.

Note that the neural network 90, the D/A conversion element 91, and the first input pre-processing element 92 are the same as those used in the seventh embodiment described above, and a detailed description thereof will be omitted.

When an unknown analog input signal $X_L$ is input to this apparatus, the first input pre-processing element 92 subtracts $\Delta$ from the input signal for A/D conversion in the fraction omission mode, and outputs the difference as a signal $Y_L$ to the switching element 94. The switching element 94 selects this signal $Y_L$ according to a switching instruction from the control-storage element 96, and outputs the selected signal as a signal Y to the neural network 90.

The neural network 90 resets its amplifiers according to an instruction from the control-storage element 96, and receives and A/D-converts the input signal Y into binary K-bit digital signals. The neural network 90 then outputs the binary K-bit digital signals to $V_{K-1}, V_{K-2}, \ldots, V_0$ to the control-storage element 96 and the D/A conversion element 91.

The D/A conversion element 91 converts these digital signals into an analog signal, and outputs the analog signal to the second input pre-processing element 93 as an analog signal $z_{-1}$ corresponding to an Lth-digit digital signal.

The control-storage element 96 stores the input digital signals at a predetermined address for the Lth digit, and instructs the delay element 95 to output the output signal Y from the switching element to the second input pre-processing element 93 as a signal $Y_{-1}$. The second input pre-processing element 93 adds $\Delta$ to the signal $Y_{-1}$ to restore the original analog input signal $X_L$, and subtracts the analog signal $Z_{-1}$ corresponding to the Lth-digit digital signal from the analog input signal $X_L$ to obtain a non-A/D-converted fraction $(Y_{-1}+\Delta-Z_{-1})$ of the signal $X_L$. The element 93 multiplies the obtained value with $2^K$ to set a signal level, which can be processed in the neural network 90, and furthermore, subtracts $\Delta$ from the product to allow A/D conversion in the fraction omission mode. The element 93 then transmits the signal as a signal $Y_{\overline{L}}$ to the switching element 94.

Thereafter, the switching element 94 selects the output signal $Y_{\overline{L}}$ from the second input pre-processing element 93 according to the switching instruction from the control-storage element 96, and outputs it as a signal Y to the neural network 90. Upon reception of the signal Y, the neural network 90 A/D-converts an analog signal determined as a fraction in immediately preceding A/D conversion into $2^K$-ary (L-1)th-digit digital signals, and outputs these signals.

In this manner, these operations are repeated. When $2^K$-ary 1st-digit digital signals are obtained, the control-storage element 96 transmits $2^K$-ary L-digit (binary K×L bit) digital signals obtained by A/D converting the original analog input signal $X_L$ as outputs of the apparatus of this embodiment.

Therefore, this embodiment can advantageously reduce the number of neural networks, or the like to one as compared to the seventh embodiment described above. An operation time requires an excessive time corresponding to an operation time in the control-storage element 96. However, if the control-storage element 96 comprises a high-speed element, sufficiently high-speed A/D conversion can be realized.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A signal processing apparatus using a neural network, comprising:
    reference signal generating means for generating a plurality of reference signals each having different signal values;
    complement signal generating means for receiving the reference signals, and an input signal as an object to be processed, and generating a plurality of complement signals indicating complement values of the reference signals by obtaining a first product by multiplying the input signal with a natural number and mathematically combining said first product with said reference signals;
    multiplication means for receiving the reference signals and the complement signals, and multiplying the reference signals with the corresponding complement signals, thereby obtaining second products; and
    a neural network, in which a plurality of neurons are suppression-mutual-coupled, said neurons receive the second products obtained by said multiplication means, and one of said neurons which receives the second product having a largest value outputs a spark signal;
    wherein an analog signal is input as the input signal, and said reference signal generating means generates analog signals as the reference signals;
    wherein said reference signal generating means comprises means for generating N reference analog signals whose signal values have a relationship of an arithmetic sequence, said neural network outputs the spark signal from the neuron, which is applied with the reference signal most approximate to the input signal, and
    said apparatus further comprises sense means for detecting the neuron which outputs the spark signal, and converting the input signal into an N-ary 1-digit digital signal according to the detected sparking neuron 2. An apparatus according to claim 1, further comprising (M-1) A/D conversion units, which are connected in parallel with said reference signal generating means, for converting the input signal into N-ary M-digit digital signals, and
    wherein each of said A/D conversion units includes input preprocessing means, second complement signal generating means, second multiplication means, a second neural network, and second sense means, which are connected in series with each other,
    the input preprocessing means of the A/D conversion unit for processing an Nary (M-1)th digit includes means for selecting the reference analog signal, which is determined in said neural network to be most approximate to the unknown input signal, on the basis of the N-ary Mth-digit digital signal output from said sense means, and means for subtracting the selected reference analog signal from the input signal, adding a bias $\Delta$ to the difference, and multiplying the sum with N so as to generate a second input signal,
    the input preprocessing means of each of the remaining A/D conversion units includes means for selecting the reference analog signal, which is determined in the second neural network of the A/D conversion unit for processing an upper neighboring digit to be most approximate to the second input signal on the basis of a digital signal output from the sense means of the A/D conversion unit for processing the upper neighboring digit, and means for subtracting the selected reference analog signal from the second input signal generated from the A/D conversion unit for processing the upper neighboring digit, adding a bias $\Delta$ to the difference, and multiplying the sum with N so as to generate the second input signal,
    each of said second complement signal generating means generates a plurality of complement signals indicating complement values of the corresponding reference analog signals with respect to a signal value obtained by multiplying the corresponding second input signal with a natural number,
    each of said second multiplication means receives the reference analog signals, and the complement signals, and multiplies the reference analog signals with the corresponding complement signals,
    each of said second neural networks has a plurality of neurons, which are suppression-mutual-coupled, the neurons receiving the products obtained by the corresponding second multiplication means, and the neuron, which receives the product having a largest value, outputting the spark signal, and
    each of said second sense means detects the neuron, which outputs the spark signal and converts the corresponding second unknown input signal into an N-ary 1-digit digital signal according to the detected sparking neuron.

3. An apparatus according to claim 2, wherein the plurality of reference analog signals are obtained by adding a bias $\Delta$ to each of N signals whose signal values have a relationship of an arithmetic sequence.

4. An apparatus according to claim 1, further comprising input preprocessing means, switching means, and control/storage means so as to convert the input signal into N-ary M-digit digital signals, and
    wherein said switching means applies the input signal to said complement signal generating means in a first operation corresponding to Mth-digit processing, and applies an output from said input preprocessing means to said complement signal generating means in second and subsequent operations,
    said input preprocessing means includes means for selecting the reference analog signal, which is determined in said neural network in an immediately preceding operation to be most approximate to the input signal, on the basis of the digital signal output from said sense means, and means for receiving the signal to be applied to said complement signal generating means through said switching means, subtracting the selected reference analog signal from the input signal, adding a bias $\Delta$ to the difference, and outputting a signal obtained by multiplying the sum with N as an output signal of said input preprocessing means, and said control/storage means makes control to hold the N-ary 1-digit digital signal output from said sense means in the immediately preceding operation until a next operation, and to repeat judgement of the N-ary 1-digit signal M times.

5. An apparatus according to claim 4, wherein the plurality of reference analog signals are obtained by adding a bias $\Delta$ to each of N signals whose signal values have a relationship of an arithmetic sequence.

6. A signal processing apparatus using a neural network, comprising:

reference signal generating means for generating a plurality of reference signals each having different signal values;

complement signal generating means for receiving the reference signals, and an input signal as an object to be processed, and generating a plurality of complement signals indicating complement values of the reference signals by obtaining a first product by multiplying the input signal with a natural number and mathematically combining said first product with said reference signals;

multiplication means for receiving the reference signals and the complement signals, and multiplying the reference signals with the corresponding complement signals, thereby obtaining second products; and a neural network, in which a plurality of neurons are suppression-mutual-coupled, said neurons receive the second products obtained by said multiplication means, and one of said neurons which receives the second product having a largest value outputs a spark signal;

wherein an analog signal is input as the input signal, and said reference signal generating means generates analog signals as the reference signals;

wherein said reference signal generating means comprises means for generating N reference analog signals obtained by adding a bias $\Delta$ to each of N signals whose signal values have a relationship of an arithmetic sequence, said neural network outputs the spark signal from the neuron, which is applied with the reference signal most approximate to the input signal, and said apparatus further comprises sense means for detecting the neuron, which outputs the spark signal, and converting the input signal into an N-ary 1-digit digital signal according to the detected sparking neuron.

7. A signal processing apparatus using a neural network, comprising:

reference signal generating means for generating a plurality of reference signals each having different signal values;

complement signal generating means for receiving the reference signals, and an input signal as an object to be processed, and generating a plurality of complement signals indicating complement values of the reference signals by obtaining a first product by multiplying the input signal with a natural number and mathematically combining said first product with said reference signals;

multiplication means for receiving the reference signals and the complement signals, and multiplying the reference signals with the corresponding complement signals, thereby obtaining second products;

a neural network, in which a plurality of neurons are suppression-mutual-coupled, said neurons receive the second products obtained by said multiplication means, and one of said neurons which receives the second product having a largest value outputs a spark signal; and correction means, which is set with a plurality of classes serving as criterions upon clustering a plurality of input signals, is set in advance with conversion functions for function-converting the input signals in units of classes, and corrects the input signals according to the conversion function of the class determined according to the spark signal output from said neural network.

8. An apparatus according to claim 7, wherein said correction means includes:

relay means, comprising a plurality of normally open contacts, one terminal of each of which receives the input signal, for closing the normally open contact corresponding to the sparking neuron of said neural network; and a plurality of function conversion means, each of which is connected to the other terminal of a corresponding one of said normally open contacts, for function-converting the input signal input through the corresponding normally open contacts according to the conversion functions, which are set in correspondence therewith.

9. An apparatus according to claim 7, wherein said reference signal generating means generates intermediate values of the respective classes as the plurality of reference signals.

10. An apparatus according to claim 7, wherein said reference signal generating means comprises means for generating N reference analog signals whose signal values correspond to intermediate values of the classes, and have a relationship of an arithmetic sequence, said neural network outputs the spark signal from the neuron, which is applied with the reference signal most approximate to the input signal, and said apparatus further comprises sense means for detecting the neuron, which outputs the spark signal, and converting the unknown input signal into an N-ary 1-digit digital signal according to the detected sparking neuron.

11. A signal processing apparatus using a neural network, comprising:

reference signal generating means for generating a plurality of reference signals each having different signal values;

complement signal generating means for receiving the reference signals, and an input signal as an object to be processed, and generating a plurality of complement signals indicating complement values of the reference signals by obtaining a first product by multiplying the input signal with a natural number and mathematically combining said first product with said reference signals;

multiplication means for receiving the reference signals and the complement signals, and multiplying the reference signals with the corresponding complement signals, thereby obtaining second products;

a neural network, in which a plurality of neurons are suppression-mutual-coupled, said neurons receive the second products obtained by said multiplication means, and one of said neurons which receives the second product having a largest value outputs a spark signal; and inference-control means, which is set with a plurality of classes serving as criterions upon clustering a plurality of input signals, is set in advance with production rules of units of classes, and selects the production rule of a specific class of the plurality of classes according to the spark signal output from said neural network.

12. An apparatus according to claim 11, wherein said inference-control means includes a plurality of rule storage means, which are set in advance with the production rules in units of classes, and activate means for causing said rule storage means to output a specific production rule according to the spark signal output from said neural network.

13. An apparatus according to claim 11, wherein said reference signal generating means generates intermediate values of the respective classes as the plurality of reference signals.

14. A signal processing apparatus using a neural network, comprising:

reference signal generating means for generating a plurality of reference signals each having different signal values;

complement signal generating means for receiving the reference signals, and an input signal as an object to be processed, and generating a plurality of complement signals indicating complement values of the reference signals by obtaining a first product by multiplying the input signal with a natural number and mathematically combining said first product with said reference signals;

multiplication means for receiving the reference signals and the complement signals, and multiplying the reference signals with the corresponding complement signals, thereby obtaining second products;

a neural network, in which a plurality of neurons are suppression-mutual-coupled, said neurons receive the second products obtained by said multiplication means, and one of said neurons which receives the second product having a largest value outputs a spark signal; and D/A conversion means for receiving a digital signal having a predetermined bit pattern, and outputting an analog signal obtained by D/A-converting the digital signal to said complement signal generating means as the input signal, and wherein said reference signal generating means generates a plurality of analog signals corresponding to a plurality of different reference bit patterns, and said neural network outputs the spark signal from the neuron, which is applied with the analog signal corresponding to the reference bit pattern most approximate to the bit pattern of the input signal.

* * * * *